(12) United States Patent
Yu

(10) Patent No.: US 11,009,293 B2
(45) Date of Patent: May 18, 2021

(54) DIRECT CURRENT SMELTING ELECTRIC FURNACE

(71) Applicant: Wen Yu, Duyun (CN)

(72) Inventor: Wen Yu, Duyun (CN)

( * ) Notice: Subject to any disclaimer, the term of this patent is extended or adjusted under 35 U.S.C. 154(b) by 0 days.

(21) Appl. No.: 16/968,622

(22) PCT Filed: Feb. 1, 2019

(86) PCT No.: PCT/CN2019/074510
§ 371 (c)(1),
(2) Date: Aug. 10, 2020

(87) PCT Pub. No.: WO2019/154341
PCT Pub. Date: Aug. 15, 2019

(65) Prior Publication Data
US 2021/0025654 A1    Jan. 28, 2021

(30) Foreign Application Priority Data

Feb. 11, 2018    (CN) .......................... 201810139429.7
Feb. 11, 2018    (CN) .......................... 201820241594.9
(Continued)

(51) Int. Cl.
*H05B 7/144*    (2006.01)
*F27D 11/08*    (2006.01)
(Continued)

(52) U.S. Cl.
CPC ................ *F27D 11/08* (2013.01); *F27D 3/18* (2013.01); *F27D 11/10* (2013.01); *G01R 31/42* (2013.01); *F27D 11/12* (2013.01)

(58) Field of Classification Search
CPC . F27D 11/08; F27D 11/10; F27D 3/18; G01R 31/42; H02M 7/08; H02M 7/17;
(Continued)

(56) References Cited

U.S. PATENT DOCUMENTS 3,949,151 A * 4/1976 Kerton ..................... H05B 7/06
373/108
4,406,008 A * 9/1983 Konig .................... H05B 7/144
373/102
(Continued)

FOREIGN PATENT DOCUMENTS

CN        201297840 Y    8/2009
CN        101628717 A    1/2010
(Continued)

*Primary Examiner* — Hung D Nguyen
(74) *Attorney, Agent, or Firm* — Bayramoglu Law Offices LLC

(57) ABSTRACT

A direct current smelting electric furnace includes a rectifying control circuit, a rectifying power supply device, a short network device, a multi-load layout device including multiple electrodes, and an electric furnace body. The rectifying power supply device includes at least two double-circuit direct current power supply packs. Four output terminals of each double-circuit direct current power supply pack are connected to three electrodes in the multi-load layout device by the short network device to constitute two current circuits by an electric furnace weld pool load. Each electrode in the multi-load layout device is connected to homo-polar output terminals of a three-phase negative semi-cycle rectifying output circuit and a three-phase positive semi-cycle rectifying output circuit, separately. The rectifying power supply device-includes multiple output current circuits. The number of output current circuits of the rectifying power supply device is the same as the number of electrodes in the multi-load layout device.

20 Claims, 13 Drawing Sheets

(30) Foreign Application Priority Data

May 2, 2018 (CN) .......................... 201810411134.0
May 2, 2018 (CN) .......................... 201820643027.6

(51) Int. Cl.
| | | |
|---|---|---|
| *F27D 3/18* | (2006.01) | |
| *G01R 31/42* | (2006.01) | |
| *F27D 11/10* | (2006.01) | |
| H05B 7/148 | (2006.01) | |
| F27D 11/12 | (2006.01) | |

(58) Field of Classification Search
CPC .......... H02M 7/23; H05B 7/005; H05B 7/02; H05B 7/06; H05B 7/11; H05B 7/144; H05B 7/148; H05B 7/156; H05B 7/20; F27B 3/085; F27B 3/20; F27B 3/28
USPC ...................... 373/47, 60, 70, 102, 104, 108
See application file for complete search history.

(56) References Cited

U.S. PATENT DOCUMENTS

| | | | | |
|---|---|---|---|---|
| 4,586,188 A | * | 4/1986 | Buhler | H05B 7/144 |
| | | | | 373/108 |
| 4,725,939 A | * | 2/1988 | Boisdon | H02M 7/17 |
| | | | | 373/108 |
| 5,138,630 A | * | 8/1992 | Suga | F27B 3/085 |
| | | | | 373/108 |
| 5,204,872 A | * | 4/1993 | Staib | H05B 7/148 |
| | | | | 373/104 |
| 7,045,969 B1 | | 5/2006 | Chou | |
| 8,817,840 B2 | * | 8/2014 | Wallmeier | H05B 7/144 |
| | | | | 373/104 |
| 8,933,378 B2 | * | 1/2015 | Horger | H05B 7/144 |
| | | | | 219/497 |
| 2006/0028348 A1 | | 2/2006 | Pai | |

FOREIGN PATENT DOCUMENTS

| | | |
|---|---|---|
| CN | 201750354 U | 2/2011 |
| CN | 105529911 A | 4/2016 |

* cited by examiner

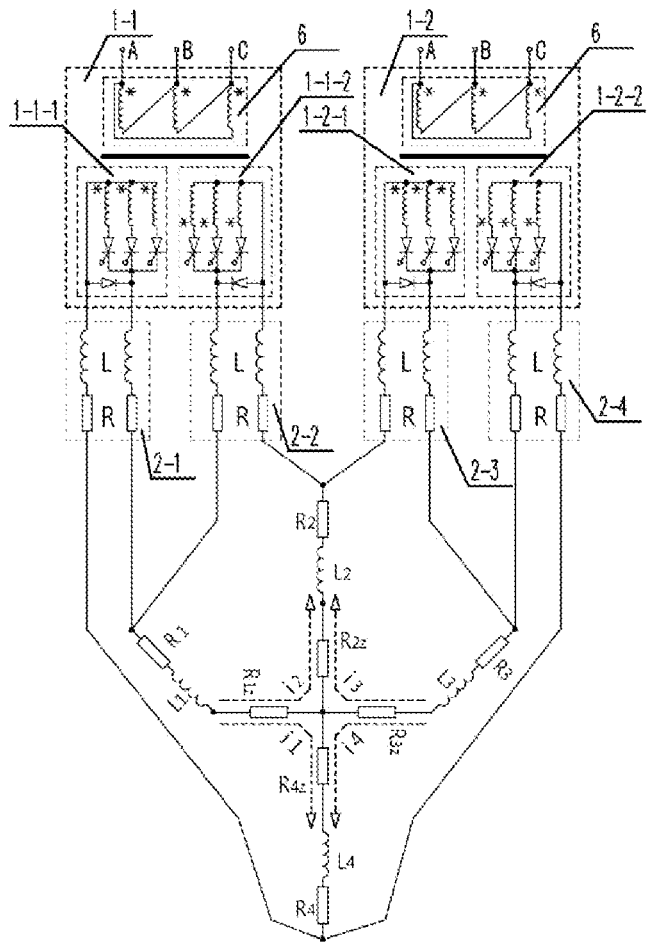

| | |
|---|---|
| L: short network equivalent inductor | i1: current circuit 1 |
| R: short network equivalent resistor | i2: current circuit 2 |
| R1: number 1 electrode equivalent resistor | i3: current circuit 3 |
| L1: number 1 electrode equivalent inductor | i4: current circuit 4 |
| R2: number 2 electrode equivalent resistor | R1z: number 1 electrode weld pool operated resistor |
| L2: number 2 electrode equivalent inductor | R2z: number 2 electrode weld pool operated resistor |
| R3: number 3 electrode equivalent resistor | R3z: number 3 electrode weld pool operated resistor |
| L3: number 3 electrode equivalent inductor | R4z: number 4 electrode weld pool operated resistor |
| R4: number 4 electrode equivalent resistor | |
| L4: number 4 electrode equivalent inductor | |
| *: like terminal of transformer winding | |

FIG. 11

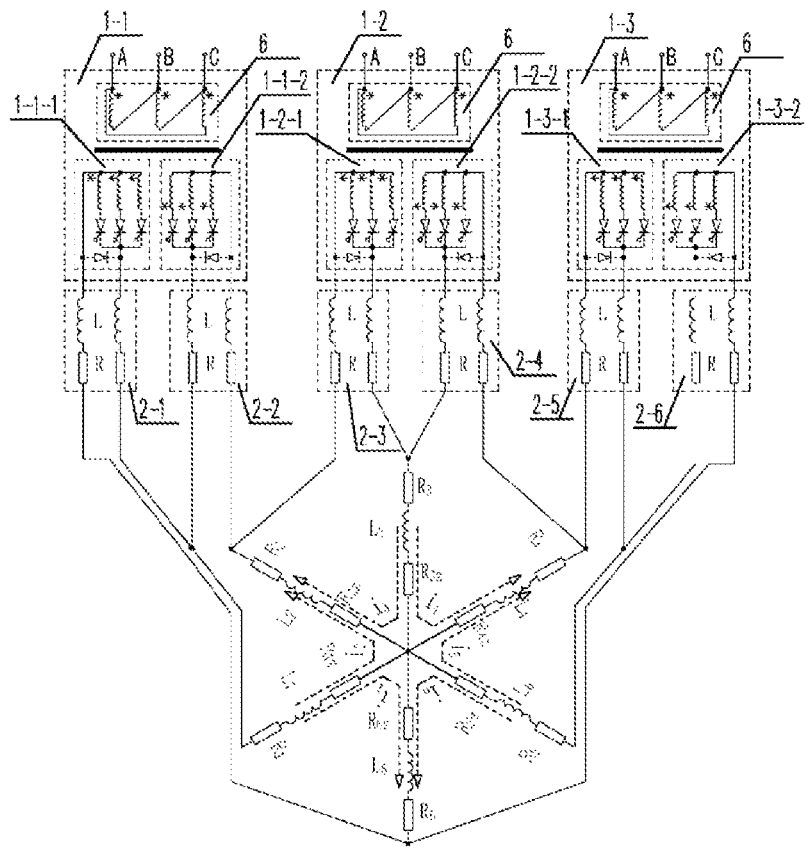

| | |
|---|---|
| L: short network equivalent inductor | I1: current circuit 1 |
| R: short network equivalent resistor | I2: current circuit 2 |
| R1: number 1 electrode equivalent resistor | I3: current circuit 3 |
| L1: number 1 electrode equivalent inductor | I4: current circuit 4 |
| R2: number 2 electrode equivalent resistor | I5: current circuit 5 |
| L2: number 2 electrode equivalent inductor | I6: current circuit 6 |
| R3: number 3 electrode equivalent resistor | R1z: number 1 electrode weld pool operated resistor |
| L3: number 3 electrode equivalent inductor | R2z: number 2 electrode weld pool operated resistor |
| R4: number 4 electrode equivalent resistor | R3z: number 3 electrode weld pool operated resistor |
| L4: number 4 electrode equivalent inductor | R4z: number 4 electrode weld pool operated resistor |
| R5: number 5 electrode equivalent resistor | R5z: number 5 electrode weld pool operated resistor |
| L5: number 5 electrode equivalent inductor | R6z: number 6 electrode weld pool operated resistor |
| R6: number 6 electrode equivalent resistor | |
| L6: number 6 electrode equivalent inductor | |
| *: like terminal of transformer winding | |

FIG. 15

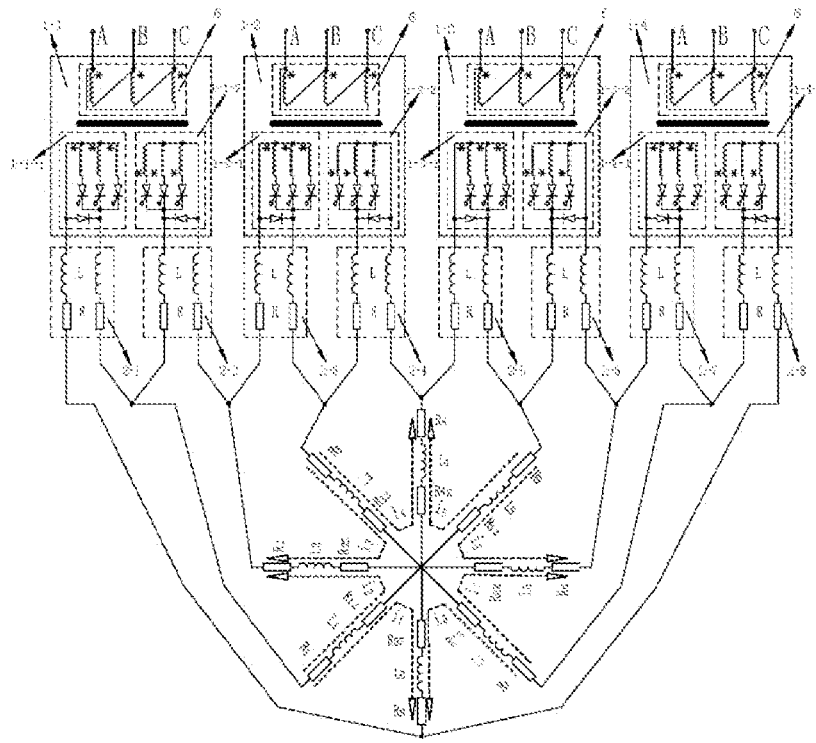

| | | | |
|---|---|---|---|
| L: | short network equivalent inductor | i1: | current circuit 1 |
| R: | short network equivalent resistor | i2: | current circuit 2 |
| R1: | number 1 electrode equivalent resistor | i3: | current circuit 3 |
| L1: | number 1 electrode equivalent inductor | i4: | current circuit 4 |
| R2: | number 2 electrode equivalent resistor | i5: | current circuit 5 |
| L2: | number 2 electrode equivalent inductor | i6: | current circuit 6 |
| R3: | number 3 electrode equivalent resistor | i7: | current circuit 7 |
| L3: | number 3 electrode equivalent inductor | i8: | current circuit 8 |
| R4: | number 4 electrode equivalent resistor | R1z: | number 1 electrode weld pool operated resistor |
| L4: | number 4 electrode equivalent inductor | R2z: | number 2 electrode weld pool operated resistor |
| R5: | number 5 electrode equivalent resistor | R3z: | number 3 electrode weld pool operated resistor |
| L5: | number 5 electrode equivalent inductor | R4z: | number 4 electrode weld pool operated resistor |
| R6: | number 6 electrode equivalent resistor | R5z: | number 5 electrode weld pool operated resistor |
| L6: | number 6 electrode equivalent inductor | R6z: | number 6 electrode weld pool operated resistor |
| R7: | number 7 electrode equivalent resistor | R7z: | number 7 electrode weld pool operated resistor |
| L7: | number 7 electrode equivalent inductor | R8z: | number 8 electrode weld pool operated resistor |
| R8: | number 8 electrode equivalent resistor | | |
| L8: | number 8 electrode equivalent inductor | | |
| *: | like terminal of transformer winding | | |

FIG. 18

DIRECT CURRENT SMELTING ELECTRIC FURNACE

CROSS REFERENCE TO THE RELATED APPLICATIONS

This application is the national phase entry of International Application No. PCT/CN2019/074510, filed on Feb. 1, 2019, which is based upon and claims priority to Chinese Patent Application No. 201810139429.7, filed on Feb. 11, 2018; Chinese Patent Application No. 201820241594.9, filed on Feb. 11, 2018; Chinese Patent Application No. 201810411134.0, filed on May 2, 2018; and Chinese Patent Application No. 201820643027.6, filed on May 2, 2018, the entire contents of which are incorporated herein by reference.

TECHNICAL FIELD

The present disclosure relates to the technical field of electric arc furnaces, in particular to a direct current smelting electric furnace.

BACKGROUND

Currently, an alternating current power supply technology is basically adopted for smelting electric furnaces in China and abroad. All of the smelting electric furnaces using the alternating current power supply technology are powered by an alternating current with an industrial frequency of 50 Hz-60 Hz. Due to the load characteristic of low voltage and high current of the smelting electric furnace, the eddy current loss of ferromagnetic parts around an electric furnace short network is large. As the existence of inductive reactance factor of a conducting circuit of an electric furnace short network causes it difficult to input high alternating current electric energy into an electric furnace weld pool, coexistence of heavy current working condition and the inductive reactance of the conducting circuit of the electric furnace short network causes a low power factor of the whole system of the alternating current electric furnace. The electrode arc of the alternating current electric furnace is ignited and extinguished 100 times~120 times per second, then the arc is unstable in combustion, causing defects of large consumption due to electrode breakage, high ore consumption and power consumption of products per ton, and so on during production.

There are fewer electric furnaces adopting the direct current power supply technology, and currently, all of the direct current electric furnaces adopting the direct current power supply technology basically need to adopt the bottom electrode technology, but it is difficult for the bottom electrode to be widely spread and applied in the smelting industry because the bottom electrode is easy to burn.

In recent years, some enterprises try to build and use a multi-electrode direct current electric furnace system, which finally causes uneven power distribution inside the electric furnace weld pool basically because the problem of matching a direct current power supply device with an electric furnace weld pool load cannot be solved, then in production practice, the smelting index is not ideal, and the advantage of heavy current transmission of the direct current electric energy fails to be fully exerted to bring practical industrial application value to the smelting work.

SUMMARY

In view of this, the present disclosure provides a direct current smelting electric furnace, which can increase the number of current circuits of weld pool load between electrodes, and allow the electric power inside the electric furnace weld pool to be uniformly distributed, such that the characteristics of a direct current power supply device are matched with the load characteristics of the electric furnace weld pool, and the practical industrial operating value of smelting with a direct current is improved.

In a first aspect, an embodiment of the present disclosure provides a direct current smelting electric furnace, including: a rectifying control circuit, a rectifying power supply device, a short network device, a multi-load layout device including multiple electrodes, and an electric furnace body; the rectifying control circuit is connected with the rectifying power supply device, the rectifying power supply device is connected with the multi-load layout device through the short network device, and the multi-load layout device is connected with a weld pool inside the electric furnace body; the rectifying control circuit is configured to control the rectifying power supply device to operate; the rectifying power supply device is configured to provide direct current electric energy to the multi-load layout device; the short network device is configured to be used by an electrical connection line between the rectifying power supply device and the multi-load layout device; the multi-load layout device is configured to generate, after being energized, arc heat and resistance heat inside the weld pool of the electric furnace body, so that the arc heat and the resistance heat smelt furnace materials inside the weld pool of the electric furnace body;

In the above, the rectifying power supply device includes at least two double-circuit direct current power supply packs, each double-circuit direct current power supply pack includes a three-phase negative semi-cycle rectifying output circuit and a three-phase positive semi-cycle rectifying output circuit, each three-phase negative semi-cycle rectifying output circuit includes a first positive output terminal and a first negative output terminal, each three-phase positive semi-cycle rectifying output circuit includes a second positive output terminal and a second negative output terminal, four output terminals of each double-circuit direct current power supply pack are respectively connected with three electrodes of the multi-load layout device including multiple electrodes through the short network device, to constitute two current circuits through electric furnace weld pool load, each electrode of the multi-load layout device is connected, through the short network device, with two homo-polar output terminals of the three-phase negative semi-cycle rectifying output circuit and the three-phase positive semi-cycle rectifying output circuit associated with the current circuit, and the number of output current circuits of the rectifying power supply device is the same as the number of electrodes of the multi-load layout device, each double-circuit direct current power supply pack further includes a transformer three-phase primary side winding, and the transformer three-phase primary side winding, after being energized, respectively supplies three-phase alternating electric energy with electromagnetic mutual inductance to the three-phase negative semi-cycle rectifying output circuit and the three-phase positive semi-cycle rectifying output circuit through a transformer ferromagnetic core.

In combination with the first aspect, an embodiment of the present disclosure provides a first possible embodiment of the first aspect, wherein two homo-polar output terminals of each double-circuit direct current power supply pack, after passing through the short network device, are collinearly connected with one electrode of the multi-load layout device, other two heteropolar output terminals of each double-circuit direct current power supply pack, after passing through the short network device, are connected with other two adjacent heteropolar electrodes associated with the current circuit in the multi-load layout device.

In combination with the first aspect, an embodiment of the present disclosure provides a second possible embodiment of the first aspect, wherein the three-phase positive semi-cycle rectifying output circuit outputs a three-pulse direct current with the three-phase positive semi-cycle rectifying waveform, the three-phase negative semi-cycle rectifying output circuit outputs the three-pulse direct current with the three-phase negative semi-cycle rectifying waveform, an arc current between the electrode and the furnace materials of the weld pool of the electric furnace is six-pulse direct current, and wherein a phase difference of alternating current components of corresponding phases of the three-phase positive semi-cycle rectifying waveform and the three-phase negative semi-cycle rectifying waveform is 180 degrees.

In combination with the first aspect, an embodiment of the present disclosure provides a third possible embodiment of the first aspect, wherein the total number of electrodes of the multi-load layout device is an even number greater than 2, the number of the double-circuit direct current power supply packs is 50% of the total number of electrodes of the multi-load layout device, and the number of the three-phase negative semi-cycle rectifying output circuit in the rectifying power supply device, the number of the three-phase positive semi-cycle rectifying output circuit in the rectifying power supply device, and 50% of the total number of electrodes of the multi-load layout device are the same.

In combination with the first aspect, an embodiment of the present disclosure provides a fourth possible embodiment of the first aspect, wherein a planar layout of the multiple electrodes of the multi-load layout device is in a triangular shape, a square shape, a rectangular shape or a parallelogram, and a distance between adjacent electrodes is equal.

Optionally, the total number of electrodes of the multi-load layout device is four, and a planar layout of the four electrodes may be in a square shape.

Optionally, the total number of electrodes of the multi-load layout device is six, and a planar layout of the six electrodes may be in a triangular shape, a rectangular shape or a parallelogram.

Optionally, the total number of electrodes of the multi-load layout device is eight, and a planar layout of the eight electrodes may be in a rectangular shape or a parallelogram.

In combination with the first aspect, an embodiment of the present disclosure provides a fifth possible embodiment of the first aspect, wherein the short network device includes a plurality of short network groups, each short network group includes two equivalent conductive wires, equivalent circuit inductive reactance of the two equivalent conductive wires of the short network group is further used as an interphase reactor for output of the rectifying power supply device, and each output terminal of the rectifying power supply device is connected with one electrode through one equivalent conductive wire in one short network group.

In combination with the first aspect, an embodiment of the present disclosure provides a sixth possible embodiment of the first aspect, wherein the three-phase negative semi-cycle rectifying output circuit includes: a transformer first three-phase secondary side winding and a first high-power rectifying assembly, the first high-power rectifying assembly includes three first uncontrollable rectifying diodes, unlike terminals of the transformer first three-phase secondary side winding are respectively connected with anodes of the three first uncontrollable rectifying diodes, cathodes of the three first uncontrollable rectifying diodes, after being collinearly connected, are connected with the first positive output terminal, and like terminals of the transformer first three-phase secondary side winding, after being collinearly connected, are connected with the first negative output terminal;

the three-phase positive semi-cycle rectifying output circuit includes: a transformer second three-phase secondary side winding and a second high-power rectifying assembly, the second high-power rectifying assembly includes three second uncontrollable rectifying diodes, like terminals of the transformer second three-phase secondary side winding are connected with anodes of the three second uncontrollable rectifying diodes, respectively, and cathodes of the three second uncontrollable rectifying diodes, after being collinearly connected, are connected with the second positive output terminal; and unlike terminals of the transformer second three-phase secondary side winding, after being collinearly connected, are connected with the second negative output terminal.

In combination with the first aspect, an embodiment of the present disclosure provides a seventh possible embodiment of the first aspect, wherein the three-phase negative semi-cycle rectifying output circuit includes: a transformer first three-phase secondary side winding, a first high-power rectifying assembly, and a first freewheel diode, the first high-power rectifying assembly includes three first controllable rectifying thyristors, control electrodes of the three first controllable rectifying thyristors are connected with the rectifying control circuit, unlike terminals of the transformer first three-phase secondary side winding are respectively connected with anodes of the three first controllable rectifying thyristors, cathodes of the three first controllable rectifying thyristors, after being collinearly connected, are connected with a cathode of the first freewheel diode and the first positive output terminal, and like terminals of the transformer first three-phase secondary side winding, after being collinearly connected, are connected with an anode of the first freewheel diode and the first negative output terminal; and the three-phase positive semi-cycle rectifying output circuit includes: a transformer second three-phase secondary side winding, a second high-power rectifying assembly, and a second freewheel diode, the second high-power rectifying assembly includes three second controllable rectifying thyristors, control electrodes of the three second controllable rectifying thyristors are connected with the rectifying control circuit, like terminals of the transformer second three-phase secondary side winding are respectively connected with anodes of the three second controllable rectifying thyristors, cathodes of the three second controllable rectifying thyristors, after being collinearly connected, are connected with a cathode of the second freewheel diode and the second positive output terminal, and unlike terminals of the transformer second three-phase secondary side winding, after being collinearly connected, are connected with an anode of the second freewheel diode and the second negative output terminal.

Optionally, the first freewheel diode is provided to obtain a freewheel circuit for a load circuit-induced current when the three-phase negative semi-cycle rectifying output circuit is not in full-load output, preventing the load circuit-induced current from returning to the transformer first three-phase secondary side winding; and the second freewheel diode is provided to obtain a freewheel circuit for the load circuit-induced current when the three-phase positive semi-cycle rectifying output circuit is not in full-load output, preventing the load circuit-induced current from returning to the transformer second three-phase secondary side winding.

Beneficial effects brought about by the embodiments of the present disclosure include, for example, that the defects of the smelting electric furnace using the alternating current power supply technology are avoided: the eddy current loss of ferromagnetic parts of the electric furnace can be reduced, the skin effect of the conducting circuit is small, the overcurrent capability of the electrode is enhanced, the electric energy can be easily input into the weld pool of the electric furnace, the natural power factor of operation of the electric furnace is high, the electric arc of the electrode is stable, the consumption is low, and the like; the defects in the existing direct current power supply technology with a bottom electrode are avoided: the present disclosure does not need the bottom electrode, then the shortcoming that the bottom electrode is easy to burn can be avoided, and it is easy to expand use of the present disclosure and the use cost is reduced; the defects that the power supply device is not matched with the electric furnace weld pool load in the existing multi-electrode direct current electric furnace technology are avoided: the rectifying power supply device is optimally designed to solve the problem of overlarge power consumption thereof, the number of current circuits of weld pool load between electrodes of the smelting electric furnace is reasonably increased, such that the electric power in the weld pool of the electric furnace is uniformly distributed, finally, the output characteristic of the rectifying power supply device is matched with the load characteristics of the electric furnace weld pool, and thus the practical industrial operating value of smelting with a direct current is improved.

Other features and advantages of the present disclosure will be illustrated in the following description, and will partially become obvious from the description, or will be understood by implementing the present disclosure. The objects and other advantages of the present disclosure are achieved and obtained through the structures specifically indicated in the description, the claims and the accompanying drawings.

In order to make it more obvious and easier to understand the above objects, features and advantages of the present disclosure, preferable examples are particularly illustrated in the following to give detailed description below in conjunction with accompanying drawings.

BRIEF DESCRIPTION OF THE DRAWINGS

In order to more clearly illustrate technical solutions in specific embodiments of the present disclosure or the prior art, accompanying drawings which need to be used for description of the specific embodiments or the prior art will be introduced briefly below, and apparently, the accompanying drawings in the description below merely show some embodiments of the present disclosure, and those ordinarily skilled in the art still could obtain other accompanying drawings in light of these accompanying drawings, without creative effort.

FIG. 11 is an equivalent circuit diagram of the direct current smelting electric furnace, having four electrodes, provided in an embodiment of the present disclosure;

FIG. 15 is an equivalent circuit diagram of the direct current smelting electric furnace, having six electrodes, provided in an embodiment of the present disclosure;

FIG. 18 is an equivalent circuit diagram of the direct current smelting electric furnace, having eight electrodes, provided in an embodiment of the present disclosure.

Figure 1:
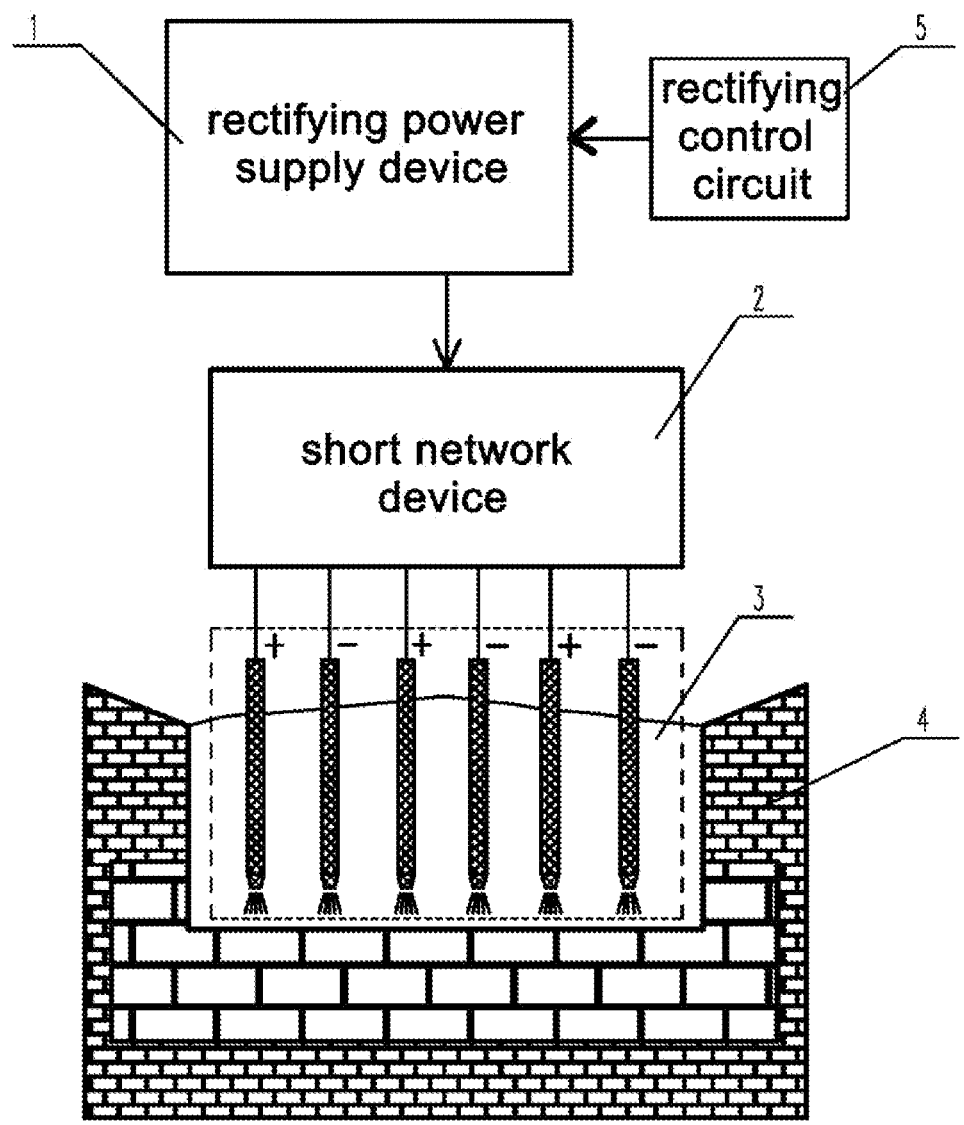
FIG. 1 is a structural view of a direct current smelting electric furnace provided in an embodiment of the present disclosure.

Illustration of reference numerals: 1—rectifying power supply device; 2—short network device; 3—multi-load layout device; 4—electric furnace body; 5—rectifying control circuit; 6—transformer three-phase primary side winding; 1-1—first double-circuit direct current power supply pack; 1-2—second double-circuit direct current power supply pack; 1-3—third double-circuit direct current power supply pack; 1-4—fourth double-circuit direct current power supply pack.

DETAILED DESCRIPTION

In order to make objects, technical solutions and advantages of the embodiments of the present disclosure clearer, the technical solutions of the present disclosure will be described clearly and completely below in conjunction with accompanying drawings, and apparently, the embodiments described are merely some but not all embodiments of the present disclosure. All of other embodiments obtained by those ordinarily skilled in the art based on the embodiments of the present disclosure without using creative effort shall fall within the scope of protection of the present disclosure.

In order to facilitate understanding the present embodiment, first a direct current smelting electric furnace disclosed in an embodiment of the present disclosure is introduced in detail.

In combination with what is shown in FIG. 1, FIG. 2a, FIG. 10, FIG. 12, FIG. 13, FIG. 14, FIG. 16, and FIG. 17, an embodiment of the present disclosure provides a direct current smelting electric furnace, including a rectifying control circuit 5, a rectifying power supply device 1, a multi-load layout device 3 including multiple electrodes, a short network device 2, and an electric furnace body 4, wherein the rectifying control circuit 5 is connected with the rectifying power supply device 1, the rectifying power supply device is connected with the multi-load layout device 3 through the short network device 2, and the multi-load layout device 3 is connected with a weld pool inside the electric furnace body; the rectifying control circuit 5 is configured to control the rectifying power supply device 1 to operate; the rectifying power supply device 1 is configured to provide direct current electric energy to the multi-load layout device 3; the short network device 2 is configured to be used by an electrical connection line of the rectifying power supply device 1 and the multi-load layout device 3; the multi-load layout device 3 is configured to generate, after being energized, arc heat and resistance heat inside the electric furnace weld pool, so that the arc heat and resistance heat smelt furnace materials inside the electric furnace weld pool.

In the above, the rectifying power supply device 1 includes at least two double-circuit direct current power supply packs, for example, a first double-circuit direct current power supply pack 1-1, a second double-circuit direct current power supply pack 1-2, a third double-circuit direct current power supply pack 1-3, and a fourth double-circuit direct current power supply pack 1-4 shown in FIG. 2a, FIG. 10, FIG. 12, FIG. 13, FIG. 14, FIG. 16, and FIG. 17, wherein the four double-circuit direct current power supply packs are identical in construction principle. It can be seen that each double-circuit direct current power supply pack includes a three-phase negative semi-cycle rectifying output circuit and a three-phase positive semi-cycle rectifying output circuit. Each three-phase negative semi-cycle rectifying output circuit includes a first positive output terminal and a first negative output terminal. Each three-phase positive semi-cycle rectifying output circuit includes a second positive output terminal and a second negative output terminal. Each double-circuit direct current power supply pack has four output terminals. The four output terminals of each double-circuit direct current power supply pack are respectively connected with three electrodes of the multi-load layout device 3 having multiple electrodes through the short network device 2, to constitute two current circuits through the electric furnace weld pool load. Each electrode of the multi-load layout device 3 having multiple electrodes is connected with a homo-polar output terminal of one three-phase negative semi-cycle rectifying output circuit and one three-phase positive semi-cycle rectifying output circuit through the short network device 2. The rectifying power supply device 1 has a plurality of output current circuits. The number of output current circuits of the rectifying power supply device 1 is the same as the number of electrodes of the multi-load layout device 3. Each double-circuit direct current power supply pack further includes a transformer three-phase primary side winding, and the transformer three-phase primary side winding, after being energized, respectively supplies three-phase alternating electric energy with electromagnetic mutual inductance to the three-phase negative semi-cycle rectifying output circuit and the three-phase positive semi-cycle rectifying output circuit through a transformer ferromagnetic core.

In the above, two homo-polar output terminals of each double-circuit direct current power supply pack, after passing through the short network device 2, are collinearly connected with one electrode of the multi-load layout device 3, and other two heteropolar output terminals of each double-circuit direct current power supply pack, after passing through the short network device 2, are connected with other two adjacent heteropolar electrodes associated with the current circuit in the multi-load layout device 3. For example, two positive polarity output terminals of each double-circuit direct current power supply pack, after passing through the short network device 2, are collinearly connected with one positive polarity electrode of the multi-load layout device 3, and other two negative polarity output terminals of each double-circuit direct current power supply pack, after passing through the short network device 2, are connected with other two adjacent negative polarity electrodes associated with the current circuit in the multi-load layout device 3. Alternatively, two negative polarity output terminals of each double-circuit direct current power supply pack, after passing through the short network device 2, are collinearly connected with one negative polarity electrode of the multi-load layout device 3, and other two positive polarity output terminals of each double-circuit direct current power supply pack, after passing through the short network device 2, are connected with other two adjacent positive polarity electrodes associated with the current circuit in the multi-load layout device 3.

For example, when the total number of electrodes is four, the rectifying power supply device 1 supplies power using two double-circuit direct current power supply packs; four output terminals of each double-circuit direct current power supply pack are respectively connected with three electrodes of the multi-load layout device 3 through the short network device 2, to constitute two current circuits through the electric furnace weld pool load; each electrode of the multi-load layout device 3 is connected with homo-polar output terminals of one three-phase negative semi-cycle rectifying output circuit and one three-phase positive semi-cycle rectifying output circuit which are associated with a current circuit through the short network device 2, and four power outputs of the rectifying power supply device 1 constitute four current circuits through the electric furnace weld pool load between the four electrodes, with each current circuit being a three-pulse direct current; a current value of each electrode is a combined value of current values of two current circuits flowing through this electrode, and the current flowing through each electrode is a six-pulse direct current.

Figure 9A:
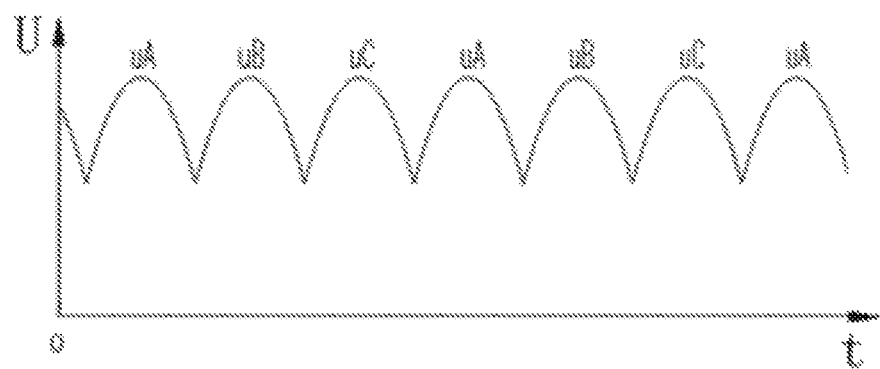
FIG. 9a is a diagram showing three-phase positive semi-cycle rectifying waveform of three-pulse direct current provided in an embodiment of the present disclosure.
Figure 9B:
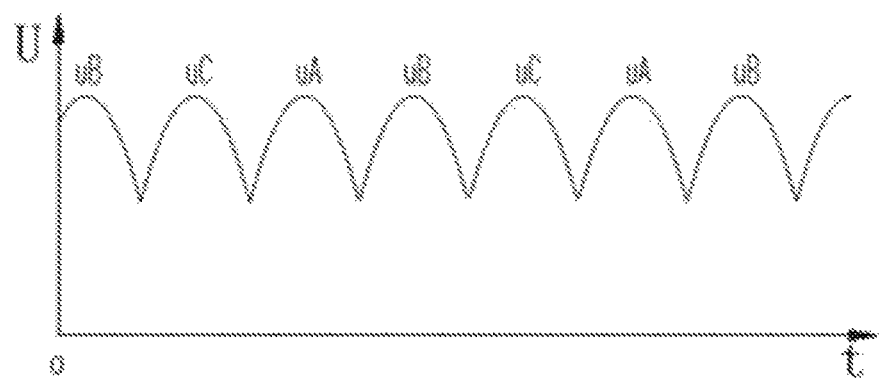
FIG. 9b is a diagram showing three-phase negative semi-cycle rectifying waveform of three-pulse direct current provided in an embodiment of the present disclosure.
Figure 9C:
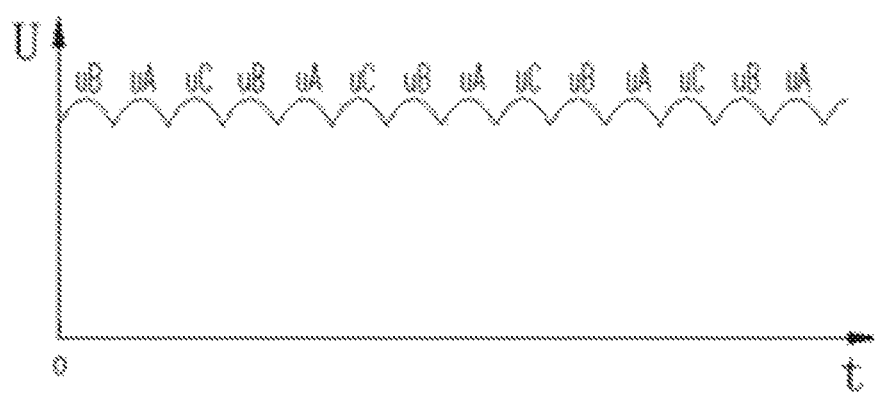
FIG. 9c is a diagram showing waveform of six-pulse direct current provided in an embodiment of the present disclosure.

For example, the three-phase positive semi-cycle rectifying output circuit outputs the three-pulse direct current with the three-phase positive semi-cycle rectifying waveform, wherein the three-phase positive semi-cycle rectifying waveform of the three-pulse direct current is as shown in FIG. 9a; the three-phase negative semi-cycle rectifying output circuit outputs the three-pulse direct current with the three-phase negative semi-cycle rectifying waveform, wherein the three-phase negative semi-cycle rectifying waveform of the three-pulse direct current is as shown in FIG. 9b; the current flowing through the electrode is a six-pulse direct current, and wherein the waveform of the six-pulse direct current is as shown in FIG. 9c, wherein a phase difference of alternating current components of corresponding phases between the three-phase positive semi-cycle rectifying waveform and the three-phase negative semi-cycle rectifying waveform is 180 degrees. It can be seen from the above that, in the present disclosure, the degree of harmonic wave is milder when the electrode arc is a six-pulse direct current than when the electrode arc is a three-pulse direct current, so that the utilization ratio of electric energy can be improved.

Figure 10:
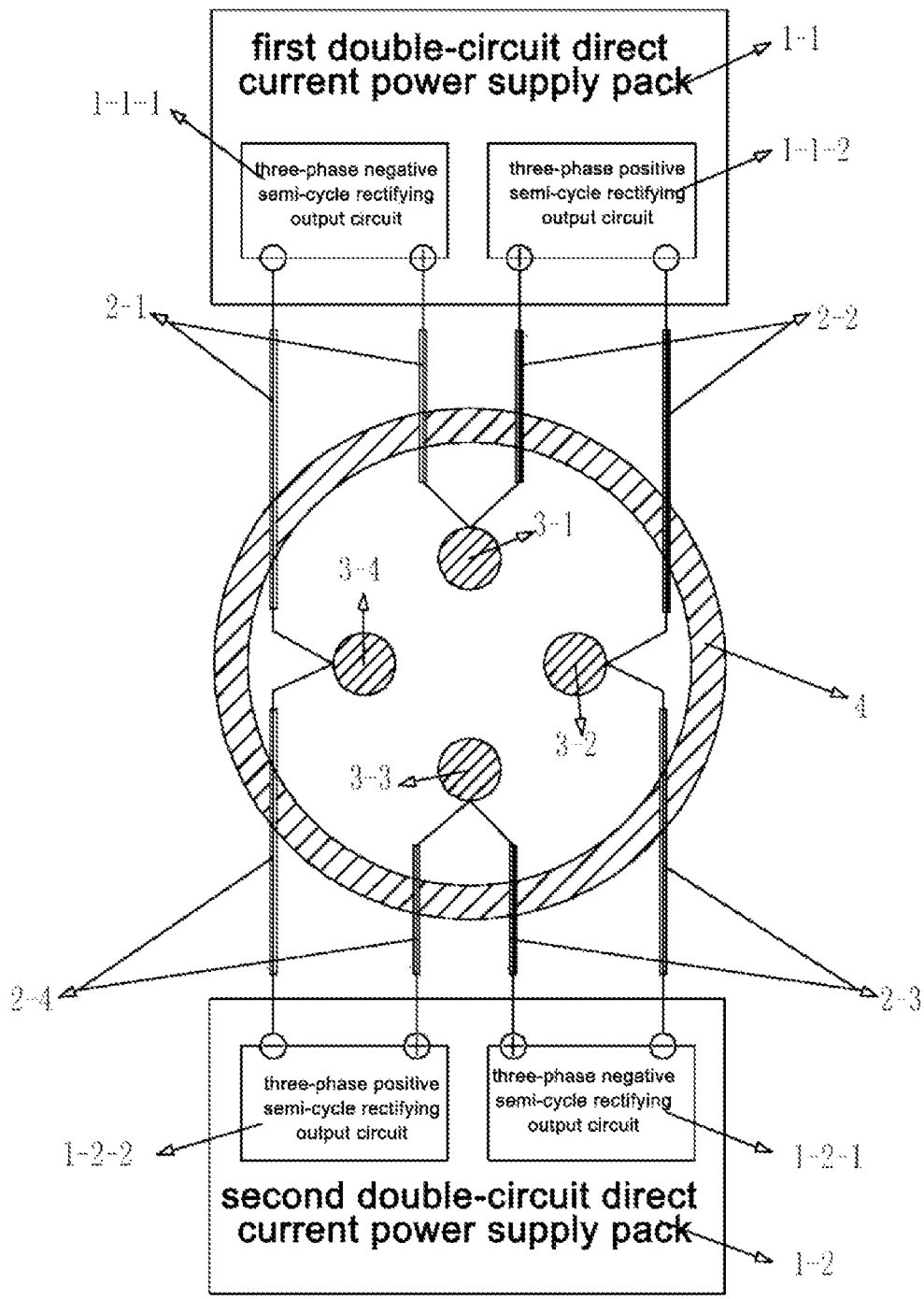
FIG. 10 is a structural view of the direct current smelting electric furnace, having four electrodes, provided in an embodiment of the present disclosure.
Figure 12:
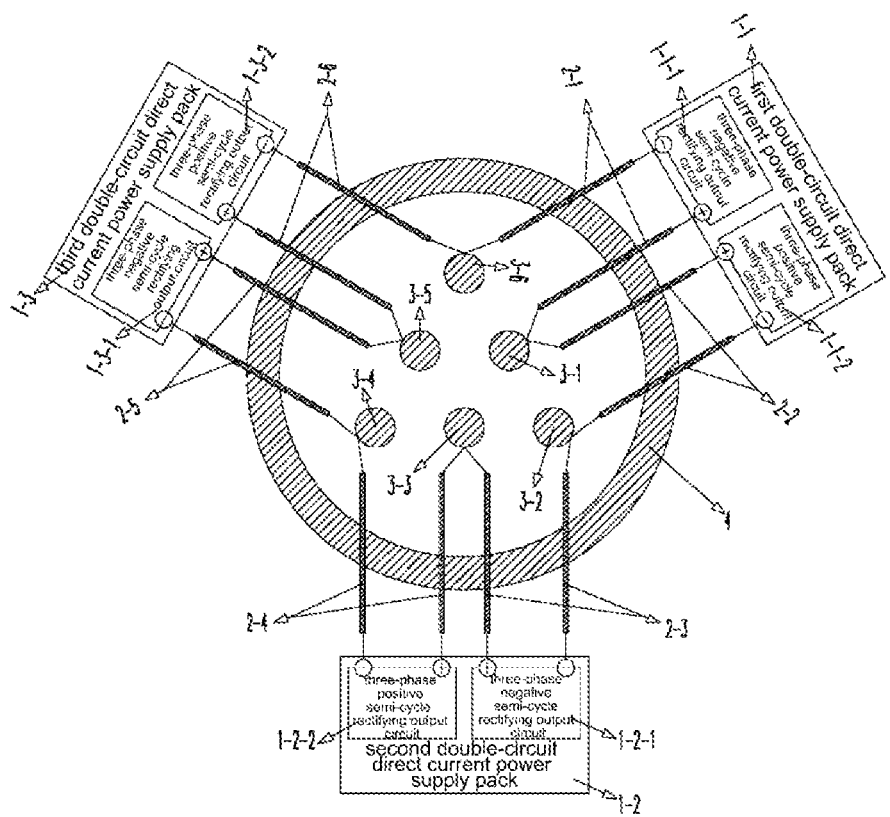
FIG. 12 is a structural view of the direct current smelting electric furnace, having six electrodes, provided in an embodiment of the present disclosure.
Figure 13:
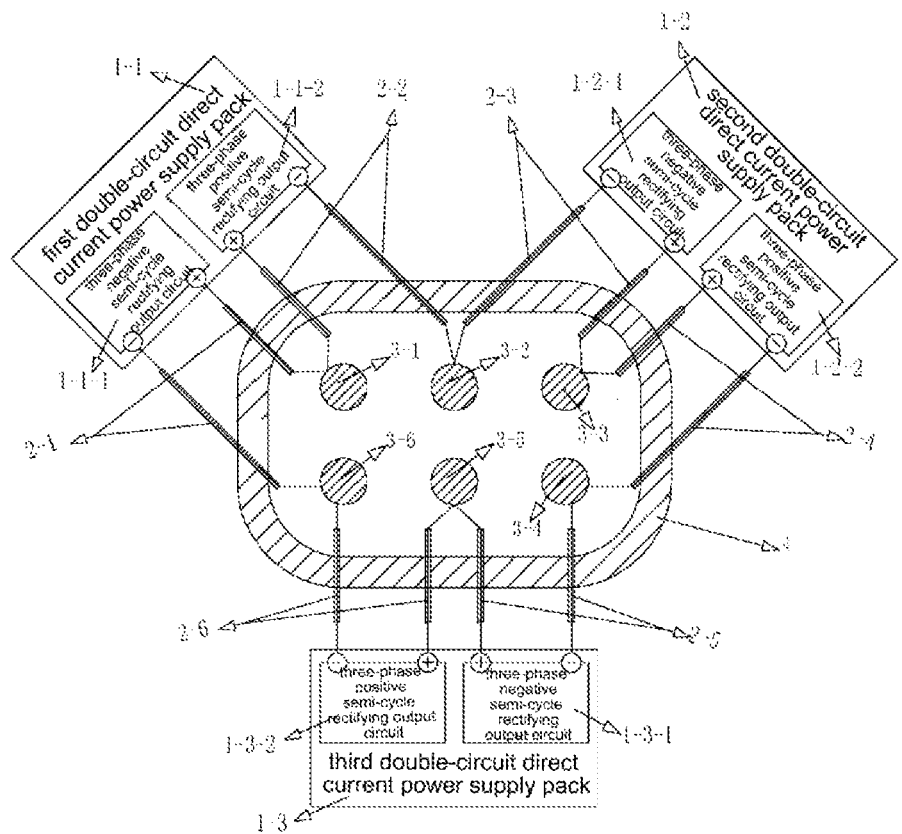
FIG. 13 is another structural view of the direct current smelting electric furnace, having six electrodes, provided in an embodiment of the present disclosure.
Figure 14:
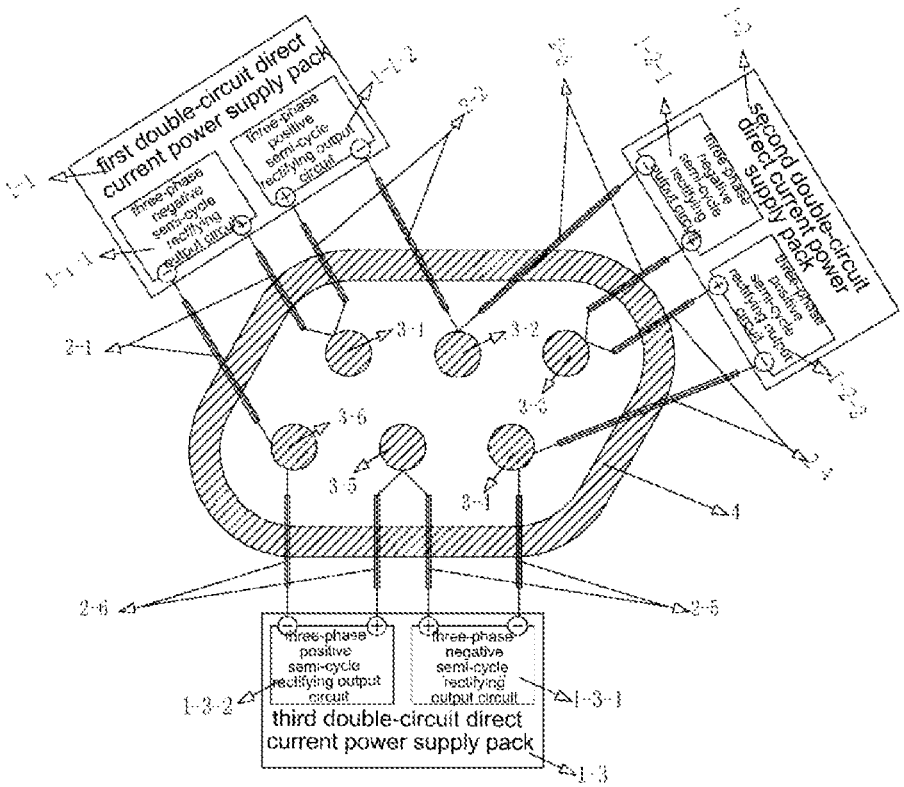
FIG. 14 is yet another structural view of the direct current smelting electric furnace, having six electrodes, provided in an embodiment of the present disclosure.
Figure 16:
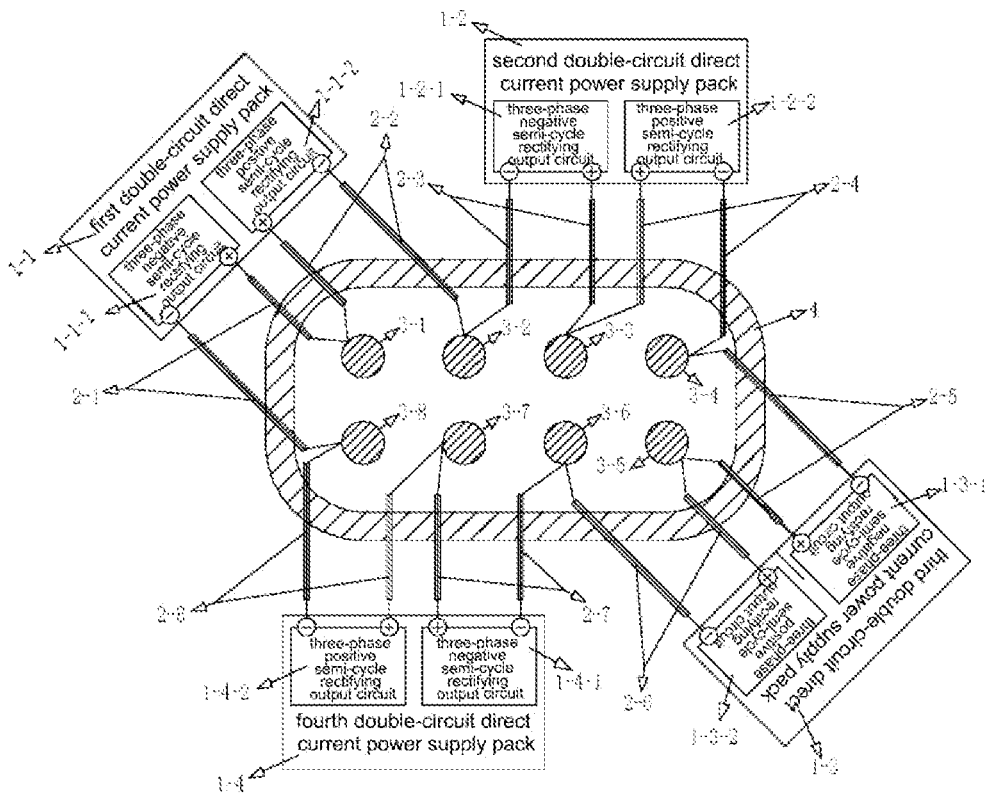
FIG. 16 is a structural view of the direct current smelting electric furnace, having eight electrodes, provided in an embodiment of the present disclosure.
Figure 17:
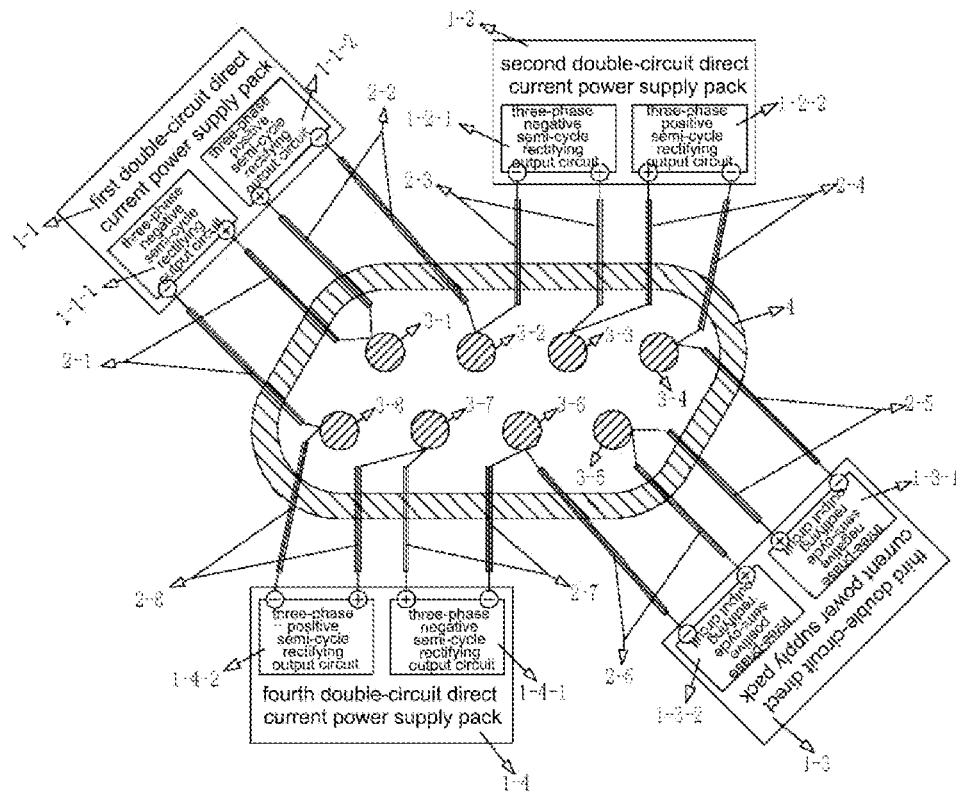
FIG. 17 is another structural view of the direct current smelting electric furnace, having eight electrodes, provided in an embodiment of the present disclosure.

In some embodiments, the total number of electrodes of the multi-load layout device 3 is an even number greater than 2, and the number of the double-circuit direct current power supply packs is half the total number of electrodes of the multi-load layout device 3. For example, when the total number of multiple electrodes in the multi-load layout device is four, and the number of the double-circuit direct current power supply packs is two, the specific connection structure and the circuit working principle of the direct current smelting electric furnace are as shown in FIG. 10~FIG. 11. When the total number of electrodes in the multi-load layout device 3 is six, and the number of the double-circuit direct current power supply packs is three, the specific connection structure and the circuit working principle of the direct current smelting electric furnace are as shown in FIG. 12 FIG. 15. When the total number of electrodes in the multi-load layout device 3 is eight, and the number of the double-circuit direct current power supply packs is four, the specific connection structure and the circuit working principle of the direct current smelting electric furnace are as shown in FIG. 16~FIG. 18. The number of current circuits of the three-phase positive semi-cycle rectifying output circuit in the rectifying power supply device 1, the number of current circuits of the three-phase negative semi-cycle rectifying output circuit in the rectifying power supply device 1, and 50% of the total number of electrodes of the multi-load layout device 3 can be made the same.

Figure 4:
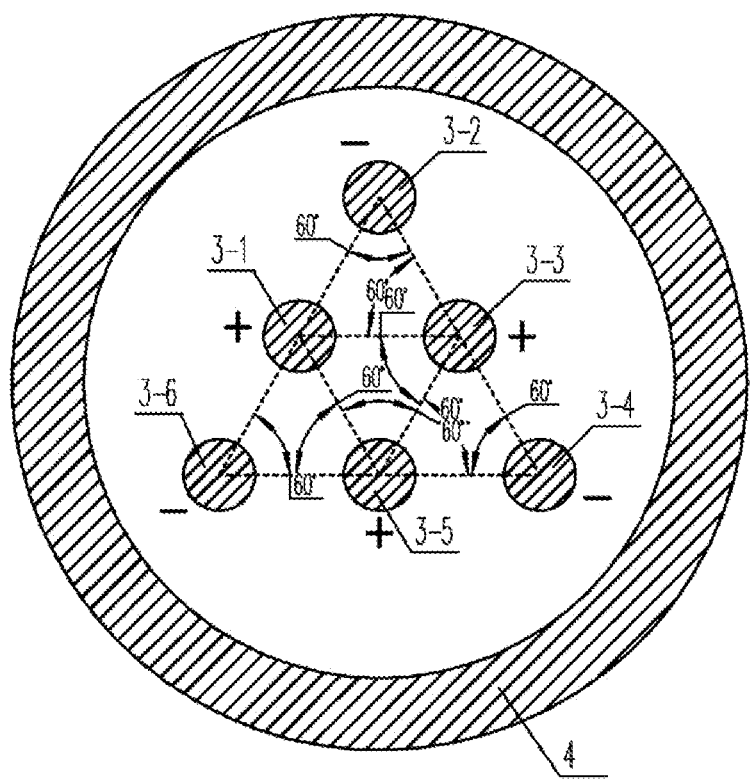
FIG. 4 is a structural view of a planar layout of six electrodes provided in an embodiment of the present disclosure.
Figure 5:
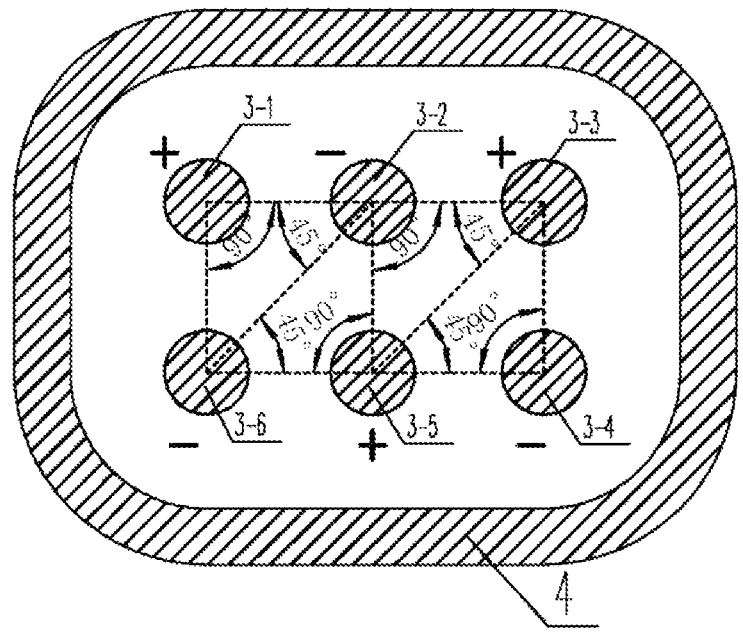
FIG. 5 is a structural view of another planar layout of six electrodes provided in an embodiment of the present disclosure.
Figure 6:
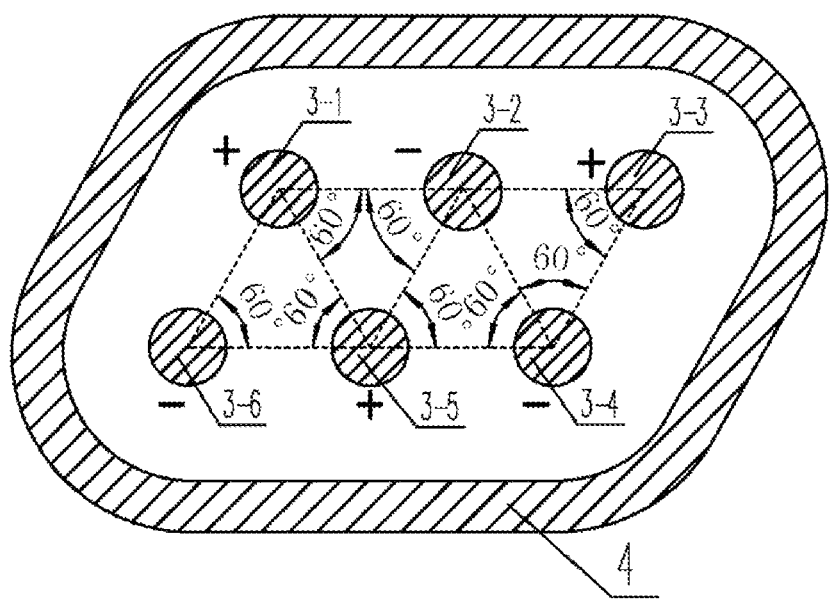
FIG. 6 is a structural view of yet another planar layout of six electrodes provided in an embodiment of the present disclosure.
Figure 7:
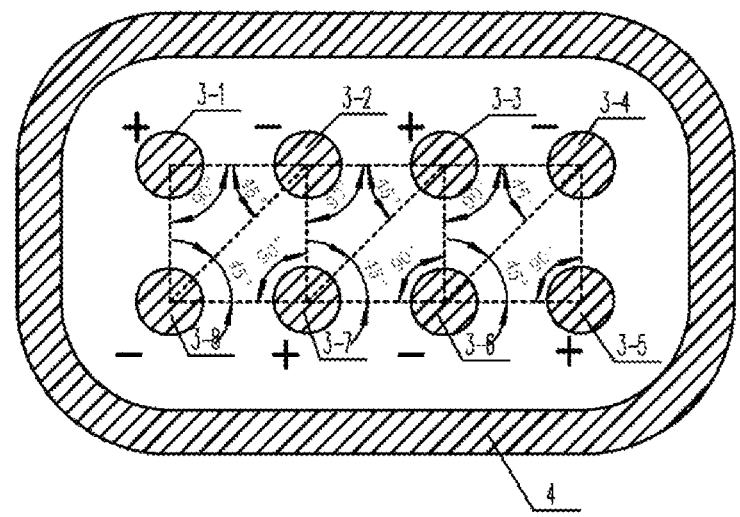
FIG. 7 is a structural view of a planar layout of eight electrodes provided in an embodiment of the present disclosure.
Figure 8:
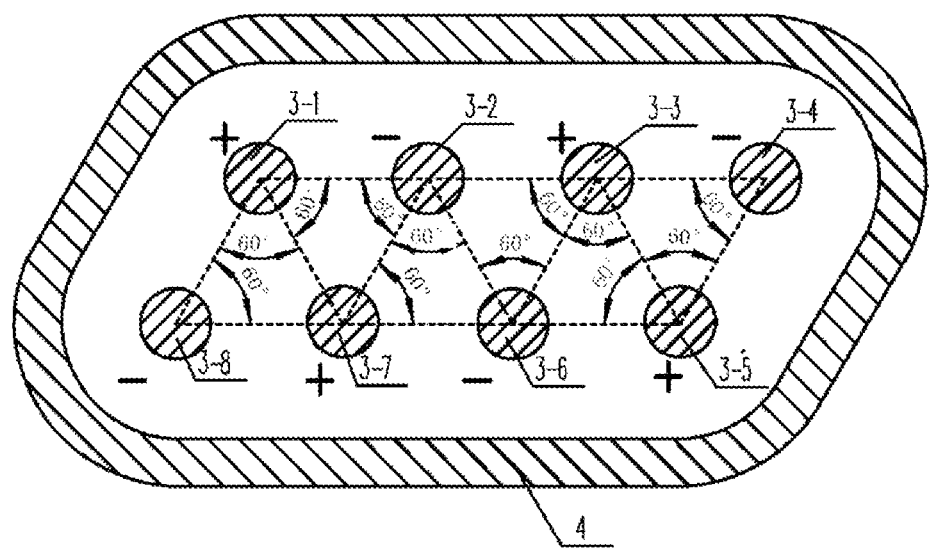
FIG. 8 is a structural view of another planar layout of eight electrodes provided in an embodiment of the present disclosure.

In combination with what is shown in FIG. 3~FIG. 8, a distance between adjacent electrodes is equal, the planar layout of the multiple electrodes of the multi-load layout device 3 is in a triangular shape, a rectangular shape or a parallelogram. Through the above layout of electrodes, the weld pool loads between the electrodes can be allowed to have the same power, thereby avoiding non-uniform distribution of electric power inside the weld pool. For example, when the total number of electrodes is four, in FIG. 3, the planar layout of the four electrodes is in a square shape, and the four electrodes are arranged at four corners of the square shape, respectively. When the total number of electrodes is six, the planar layout of the six electrodes may be in a triangular shape as shown in FIG. 4, and in combination with what is shown in FIG. 4, the triangular shape formed by the six electrodes may be composed of four small equilateral triangles, and the six electrodes are distributed at respective corners of the four small equilateral triangles; alternatively, the planar layout of the six electrodes may be in a rectangular shape as shown in FIG. 5, and in combination with what is shown in FIG. 5, the rectangular shape formed by the six electrodes may be composed of four small right-angle triangles, and the six electrodes are distributed at respective corners of the four small right-angle triangles; alternatively, the planar layout of the six electrodes may be in a parallelogram as shown in FIG. 6, and in combination with what is shown in FIG. 6, the parallelogram formed by the six electrodes may be composed of four small equilateral triangles, which are placed in a different manner from that of the four small equilateral triangles in FIG. 4, thereby obtaining the parallelogram as shown in FIG. 6. When the total number of electrodes is eight, the planar layout of the eight electrodes may be in a rectangular shape as shown in FIG. 7, and in combination with what is shown in FIG. 7, the rectangular shape formed by the eight electrodes may be composed of six small right-angle triangles, and the eight electrodes are distributed at respective corners of the six small right-angle triangles, which is similar to FIG. 5; alternatively, the planar layout of the eight electrodes may be in a parallelogram as shown in FIG. 8, and in combination with what is shown in FIG. 8, the parallelogram formed by the eight electrodes may be composed of six small equilateral triangles, and the eight electrodes are distributed at respective corners of the six small equilateral triangles, which is similar to FIG. 6.

Figure 2A:
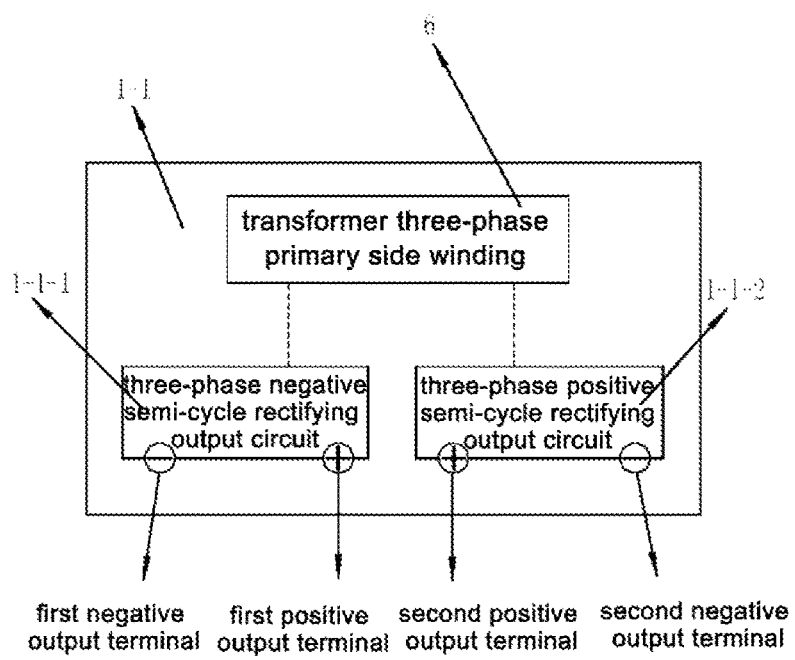
FIG. 2a is a structural view of a first double-circuit direct current power supply pack provided in an embodiment of the present disclosure.
Figure 2B:
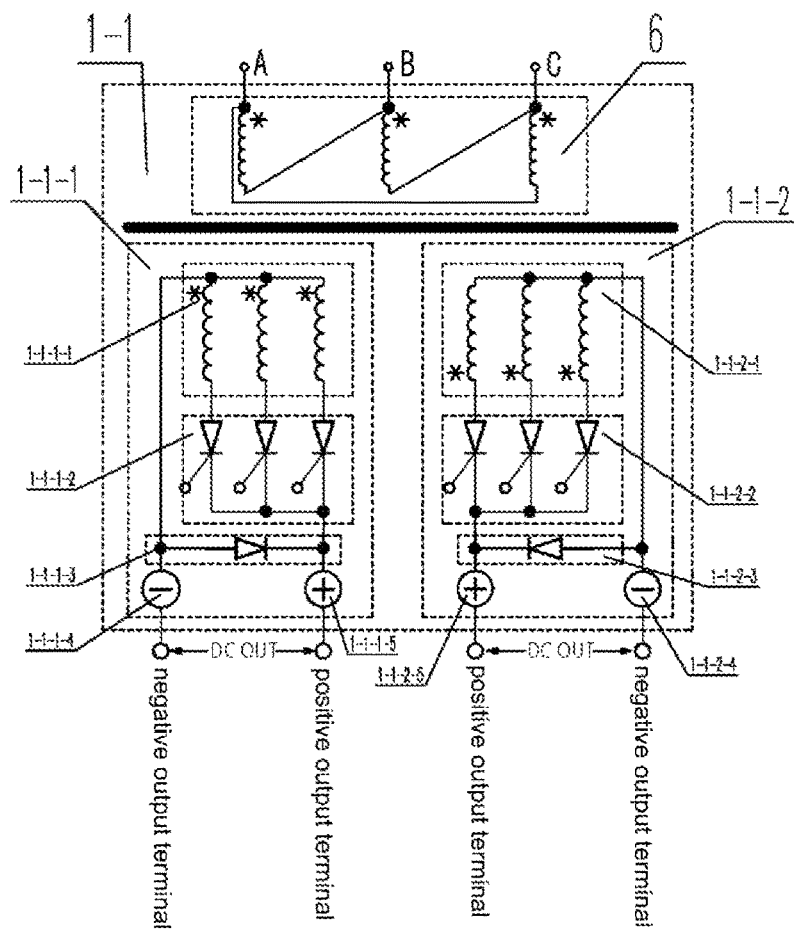
FIG. 2b is a circuit diagram of the first double-circuit direct current power supply pack provided in an embodiment of the present disclosure.
Figure 3:
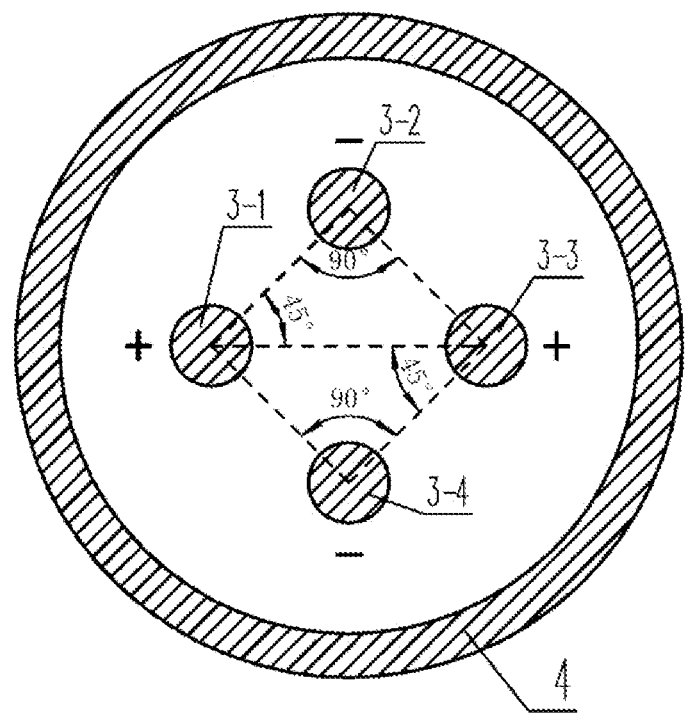
FIG. 3 is a structural view of planar layout of four electrodes provided in an embodiment of the present disclosure.

In the above, a specific circuit structure of each double-circuit direct current power supply pack in the rectifying power supply device 1 of the direct current smelting electric furnace may be in two cases. The first case applies to the situation where the electricity for load of the direct current smelting electric furnace is reduced instantaneously. In combination with what is shown in FIG. 2b, rectifying components in a first high-power rectifying assembly and a second high-power rectifying assembly in each double-circuit direct current power supply pack are replaced with uncontrollable rectifying diodes. A first freewheel diode 1-1-1-3 and a second freewheel diode 1-1-2-3 do not need to be installed in each double-circuit direct current power supply pack. The three-phase negative semi-cycle rectifying output circuit 1-1-1 includes: a transformer first three-phase secondary side winding 1-1-1-1 and a first high-power rectifying assembly 1-1-1-2. The first high-power rectifying assembly 1-1-1-2 includes three first uncontrollable rectifying diodes. Unlike terminals of the transformer first three-phase secondary side winding 1-1-1-1 are connected with anodes of the three first uncontrollable rectifying diodes, respectively, and cathodes of the three first uncontrollable rectifying diodes, after being collinearly connected, are connected with a first positive output terminal 1-1-1-5; like terminals of the transformer first three-phase secondary side winding 1-1-1-1, after being collinearly connected, are connected with a first negative output terminal 1-1-1-4. The three-phase positive semi-cycle rectifying output circuit 1-1-2 includes: a transformer second three-phase secondary side winding 1-1-2-1 and a second high-power rectifying assembly 1-1-2-2. The second high-power rectifying assembly 1-1-2-2 includes three second uncontrollable rectifying diodes. Like terminals of the transformer second three-phase secondary side winding 1-1-2-1 are connected with anodes of the three second uncontrollable rectifying diodes, respectively, and cathodes of the three second uncontrollable rectifying diodes, after being collinearly connected, are connected with a second positive output terminal 1-1-2-5; unlike terminals of the transformer second three-phase secondary side winding 1-1-2-1, after being collinearly connected, are connected with the second negative output terminal 1-1-2-4.

In combination with what is shown in FIG. 2b, the second case applies to the situation where the electricity for the load of the direct current smelting electric furnace is increased instantaneously. The three-phase negative semi-cycle rectifying output circuit 1-1-1 includes: a transformer first three-phase secondary side winding 1-1-1-1, a first high-power rectifying assembly 1-1-1-2, and a first freewheel diode 1-1-1-3. The first high-power rectifying assembly includes three first controllable rectifying thyristors. The three first controllable rectifying thyristors are connected with the rectifying control circuit 5 (connection terminals of the three first controllable rectifying thyristors and the rectifying control circuit 5 are shown in FIG. 2b). Unlike terminals of the transformer first three-phase secondary side winding 1-1-1-1 are respectively connected with anodes of the three first controllable rectifying thyristors. Cathodes of the three first controllable rectifying thyristors, after being collinearly connected, are connected with a cathode of the first freewheel diode 1-1-1-3 and the first positive output terminal 1-1-1-5; like terminals of the transformer first three-phase secondary side winding 1-1-1-1, after being collinearly connected, are connected with an anode of the first freewheel diode 1-1-1-3 and the first negative output terminal 1-1-1-4. The three-phase positive semi-cycle rectifying output circuit 1-1-2 includes: a transformer second three-phase secondary side winding 1-1-2-1, a second high-power rectifying assembly 1-1-2-2, and a second freewheel diode 1-1-2-3. The second high-power rectifying assembly 1-1-2-2 includes three second controllable rectifying thyristors. The three second controllable rectifying thyristors are connected with the rectifying control circuit 5 (connection terminals of the three second controllable rectifying thyristors and the rectifying control circuit 5 are shown in FIG. 2b). Like terminals of the transformer second three-phase secondary side winding 1-1-2-1 are respectively connected with anodes of the three second controllable rectifying thyristors. Cathodes of the three second controllable rectifying thyristors, after being collinearly connected, are connected with a cathode of the second freewheel diode 1-1-2-3 and the second positive output terminal 1-1-2-5; unlike terminals of the transformer second three-phase secondary side winding 1-1-2-1, after being collinearly connected, are connected with an anode of the second freewheel diode 1-1-2-3 and the second negative output terminal 1-1-2-4, wherein the double-circuit direct current power supply pack 1-1 includes a transformer three-phase primary side winding 6, a three-phase negative semi-cycle rectifying output circuit 1-1-1 and a three-phase positive semi-cycle rectifying output circuit 1-1-2. The first freewheel diode 1-1-1-3 provides a freewheel circuit for a load circuit-induced current when the three-phase negative semi-cycle rectifying output circuit 1-1-1 is not in full-load output, preventing the load circuit-induced current from returning to the transformer first three-phase secondary side winding 1-1-1-1, thus, the power factor of the electrical system is reduced. Likewise, the second freewheel diode 1-1-2-3 provides a freewheel circuit for the load circuit-induced current when the three-phase positive semi-cycle rectifying output circuit 1-1-2 is not in full-load output, preventing the load circuit-induced current from returning to the transformer second three-phase secondary side winding 1-1-2-1, thus, the power factor of the electrical system is reduced.

It can be seen from the above structure that each rectifying component of the first high-power rectifying assembly 1-1-1-2 and the second high-power rectifying assembly 1-1-2-2 assumes only ⅙ of the electrode current of the direct current smelting electric furnace, the number of rectifying components is ½ of a three-phase bridge rectifying device in the prior art, and the total power consumption of the rectifying component per se is ½ of the total power consumption of the three-phase bridge rectifying device in the prior art. It can be seen that the present disclosure reduces the power consumption of the three-phase bridge rectifying device per se in the prior art, and improves the power consumption efficiency of the smelting electric furnace.

It can be seen from the above that the two cases of the structures of the three-phase positive semi-cycle rectifying output circuit and the three-phase negative semi-cycle rectifying output circuit are mainly distinguished in that the controllable rectifying thyristor in the first case may be replaced with an uncontrollable rectifying diode, at which time the uncontrollable rectifying diode does not need to be connected with the rectifying control circuit, meanwhile, the freewheel diode does not need to be installed, mainly because when an uncontrollable rectifying diode is used, the uncontrollable rectifying diode has a large conduction angle, the circuit-induced current is suppressed by an interphase reactor, without returning to the winding of the transformer, therefore, there is no need for a freewheel diode, and meanwhile, the uncontrollable rectifying diode is an uncontrollable rectifying device, hence, it is unnecessary to connect the rectifying control circuit.

In the above, the short network device 2 includes a plurality of short network groups, and each short network group is represented respectively by 2-1, 2-2, 2-3, 2-4, 2-5, 2-6, 2-7 and 2-8. Each short network group includes two equivalent conductive wires. The inductive reactance of the two equivalent conductive wires is used by an output circuit of the rectifying power supply device 1 as an interphase reactor, wherein each output terminal of the rectifying power supply device 1 is connected with one electrode through one conductive wire in one short network device 2.

In practical operation, in combination with FIG. 2b, FIG. 11, FIG. 15, and FIG. 18, each double-circuit direct current power supply pack further includes a transformer three-phase primary side winding 6, and after being energized, the transformer three-phase primary side winding 6 respectively supplies three-phase alternating electric energy with electromagnetic mutual inductance to the three-phase negative semi-cycle rectifying output circuit and the three-phase positive semi-cycle rectifying output circuit through the transformer ferromagnetic core.

The direct current smelting electric furnace described above is described in detail with following three examples:

Example 1, in combination with what is shown in FIG. 10~FIG. 11, when the total number of electrodes of the multi-load layout device 3 is four, the number of double-circuit direct current power supply packs is two, the two double-circuit direct current power supply packs may be represented by a first double-circuit direct current power supply pack 1-1 and a second double-circuit direct current power supply pack 1-2. The first double-circuit direct current power supply pack 1-1 includes a three-phase negative semi-cycle rectifying output circuit 1-1-1 and a three-phase positive semi-cycle rectifying output circuit 1-1-2. The second double-circuit direct current power supply pack 1-2 includes a three-phase negative semi-cycle rectifying output circuit 1-2-1 and a three-phase positive semi-cycle rectifying output circuit 1-2-2. The four electrodes are represented by number 1 electrode 3-1, number 2 electrode 3-2, number 3 electrode 3-3, and number 4 electrode 3-4, respectively, wherein the number 1 electrode 3-1 and the number 3 electrode 3-3 are positive polarity electrodes, the number 2 electrode 3-2 and the number 4 electrode 3-4 are negative polarity electrodes, the number 1 electrode 3-1 is adjacent to the number 2 electrode 3-2 and the number 4 electrode 3-4, and the number 3 electrode 3-3 is adjacent to the number 2 electrode 3-2 and the number 4 electrode 3-4. For the first double-circuit direct current power supply pack 1-1, a positive output terminal of the three-phase negative semi-cycle rectifying output circuit 1-1-1 and a positive output terminal of the three-phase positive semi-cycle rectifying output circuit 1-1-2 are both connected with the electrode 3-1, a negative output terminal of the three-phase negative semi-cycle rectifying output circuit 1-1-1 is connected with the number 4 electrode 3-4, and a negative output terminal of the three-phase positive semi-cycle rectifying output circuit 1-1-2 is connected with the number 2 electrode 3-2. For the second double-circuit direct current power supply pack 1-2, a positive output terminal of the three-phase negative semi-cycle rectifying output circuit 1-2-1 and a positive output terminal of the three-phase positive semi-cycle rectifying output circuit 1-2-2 are both connected with the number 3 electrode 3-3, a negative output terminal of the three-phase negative semi-cycle rectifying output circuit 1-2-1 is connected with the number 2 electrode 3-2, and a negative output terminal of the three-phase positive semi-cycle rectifying output circuit 1-2-2 is connected with the number 4 electrode 3-4.

The negative output terminal of the three-phase negative semi-cycle rectifying output circuit 1-1-1 is connected with the number 4 electrode 3-4 through the short network group 1 2-1, the positive output terminal of the three-phase negative semi-cycle rectifying output circuit 1-1-1 is connected with the number 1 electrode 3-1 through the short network group 1 2-1, and the three-phase negative semi-cycle rectifying output circuit 1-1-1 forms, through the short network group 1 2-1, a current circuit i1 with the electrode weld pool operated resistance load between the number 1 electrode 3-1 and the number 4 electrode 3-4.

The negative output terminal of the three-phase positive semi-cycle rectifying output circuit 1-1-2 is connected with the number 2 electrode 3-2 through the short network group 2 2-2, the positive output terminal of the three-phase positive semi-cycle rectifying output circuit 1-1-2 is connected with the number 1 electrode 3-1 through the short network group 2 2-2, and the three-phase positive semi-cycle rectifying output circuit 1-1-2 forms, through the short network group 2 2-2, a current circuit i2 with the electrode weld pool operated resistance load between the number 1 electrode 3-1 and the number 2 electrode 3-2.

The negative output terminal of the three-phase negative semi-cycle rectifying output circuit 1-2-1 is connected with the number 2 electrode 3-2 through the short network group 3 2-3, the positive output terminal of the three-phase negative semi-cycle rectifying output circuit 1-2-1 is connected with the number 3 electrode 3-3 through the short network group 3 2-3, and the three-phase negative semi-cycle rectifying output circuit 1-2-1 forms, through the short network group 3 2-3, a current circuit i3 with the electrode weld pool operated resistance load between the number 2 electrode 3-2 and the number 3 electrode 3-3.

The negative output terminal of the three-phase positive semi-cycle rectifying output circuit 1-2-2 is connected with the number 4 electrode 3-4 through the short network group 4 2-4, the positive output terminal of the three-phase positive semi-cycle rectifying output circuit 1-2-2 is connected with the number 3 electrode 3-3 through the short network group 4 2-4, and the three-phase positive semi-cycle rectifying output circuit 1-2-2 forms, through the short network group 4 2-4, a current circuit i4 with the electrode weld pool operated resistance load between the number 3 electrode 3-3 and the number 4 electrode 3-4.

A six-pulse direct current required by an arc of the number 1 electrode 3-1 is synthesized by the current circuit i1 and the current circuit i2; a six-pulse direct current required by an arc of the number 2 electrode 3-2 is synthesized by the current circuit i2 and the current circuit i3; a six-pulse direct current required by an arc of the number 3 electrode 3-3 is synthesized by the current circuit i3 and the current circuit i4; and a six-pulse direct current required by an arc of the number 4 electrode 3-4 is synthesized by the current circuit i4 and the current circuit i1.

In the above, waveforms of currents of the current circuit i1 and the current circuit i3 are three-phase negative semi-cycle rectifying waveforms; waveforms of currents of the current circuit i2 and the current circuit i4 are three-phase positive semi-cycle rectifying waveforms; a delta-connection load of the electric furnace weld pool is a three-pulse direct current, and a phase difference of alternating current components of corresponding phases between the three-phase positive semi-cycle rectifying waveform and the three-phase negative semi-cycle rectifying waveform is 180°; and a current waveform of the arc of each electrode is six-pulse direct current, with the phase difference of 180° for alternating current components of the corresponding phases.

Example 2, in combination with what is shown in FIG. 12~FIG. 15, when the total number of electrodes of the multi-load layout device 3 is six, the number of double-circuit direct current power supply packs is three, the three double-circuit direct current power supply packs may be represented by a first double-circuit direct current power supply pack 1-1, a second double-circuit direct current power supply pack 1-2, and a third double-circuit direct current power supply pack 1-3. The first double-circuit direct current power supply pack 1-1 includes a three-phase negative semi-cycle rectifying output circuit 1-1-1 and a three-phase positive semi-cycle rectifying output circuit 1-1-2. The second double-circuit direct current power supply pack 1-2 includes a three-phase negative semi-cycle rectifying output circuit 1-2-1 and a three-phase positive semi-cycle rectifying output circuit 1-2-2. The third double-circuit direct current power supply pack 1-3 includes a three-phase negative semi-cycle rectifying output circuit 1-3-1 and a three-phase positive semi-cycle rectifying output circuit 1-3-2. The six electrodes are represented by number 1 electrode 3-1, number 2 electrode 3-2, number 3 electrode 3-3, number 4 electrode 3-4, number 5 electrode 3-5, and number 6 electrode 3-6, respectively, wherein the number 1 electrode 3-1, the number 3 electrode 3-3 and the number 5 electrode 3-5 are positive polarity electrodes, the number 2 electrode 3-2, the number 4 electrode 3-4 and the number 6 electrode 3-6 are negative polarity electrodes, the number 1 electrode 3-1 is adjacent to the number 2 electrode 3-2 and the number 6 electrode 3-6, the number 3 electrode 3-3 is adjacent to the number 2 electrode 3-2 and the number 4 electrode 3-4, and the number 5 electrode 3-5 is adjacent to the number 4 electrode 3-4 and the number 6 electrode 3-6. For the first double-circuit direct current power supply pack 1-1, a positive output terminal of the three-phase negative semi-cycle rectifying output circuit 1-1-1 and a positive output terminal of the three-phase positive semi-cycle rectifying output circuit 1-1-2 are both connected with the number 1 electrode 3-1, a negative output terminal of the three-phase negative semi-cycle rectifying output circuit 1-1-1 is connected with the number 6 electrode 3-6, and a negative output terminal of the three-phase positive semi-cycle rectifying output circuit 1-1-2 is connected with the number 2 electrode 3-2. For the second double-circuit direct current power supply pack 1-2, a positive output terminal of the three-phase negative semi-cycle rectifying output circuit 1-2-1 and a positive output terminal of the three-phase positive semi-cycle rectifying output circuit 1-2-2 are both connected with the number 3 electrode 3-3, a negative output terminal of the three-phase negative semi-cycle rectifying output circuit 1-2-1 is connected with the number 2 electrode 3-2, and a negative output terminal of the three-phase positive semi-cycle rectifying output circuit 1-2-2 is connected with the number 4 electrode 3-4. For the third double-circuit direct current power supply pack 1-3, a positive output terminal of the three-phase negative semi-cycle rectifying output circuit 1-3-1 and a positive output terminal of the three-phase positive semi-cycle rectifying output circuit 1-3-2 are both connected with the number 5 electrode 3-5, a negative output terminal of the three-phase negative semi-cycle rectifying output circuit 1-3-1 is connected with the number 4 electrode 3-4, and a negative output terminal of the three-phase positive semi-cycle rectifying output circuit 1-3-2 is connected with the number 6 electrode 3-6.

The negative output terminal of the three-phase negative semi-cycle rectifying output circuit 1-1-1 is connected with the number 6 electrode 3-6 through the short network group 1 2-1, the positive output terminal of the three-phase negative semi-cycle rectifying output circuit 1-1-1 is connected with the number 1 electrode 3-1 through the short network group 1 2-1, and the three-phase negative semi-cycle rectifying output circuit 1-1-1 forms, through the short network group 1 2-1, a current circuit i1 with the electrode weld pool operated resistance load between the number 1 electrode 3-1 and the number 6 electrode 3-6.

The negative output terminal of the three-phase positive semi-cycle rectifying output circuit 1-1-2 is connected with the number 2 electrode 3-2 through the short network group 2 2-2, the positive output terminal of the three-phase positive semi-cycle rectifying output circuit 1-1-2 is connected with the number 1 electrode 3-1 through the short network group 2 2-2, and the three-phase positive semi-cycle rectifying output circuit 1-1-2 forms, through the short network group 2 2-2, a current circuit i2 with the electrode weld pool operated resistance load between the number 1 electrode 3-1 and the number 2 electrode 3-2.

The negative output terminal of the three-phase negative semi-cycle rectifying output circuit 1-2-1 is connected with the number 2 electrode 3-2 through the short network group 3 2-3, the positive output terminal of the three-phase negative semi-cycle rectifying output circuit 1-2-1 is connected with the number 3 electrode 3-3 through the short network group 3 2-3, and the three-phase negative semi-cycle rectifying output circuit 1-2-1 forms, through the short network group 3 2-3, a current circuit i3 with the electrode weld pool operated resistance load between the number 2 electrode 3-2 and the number 3 electrode 3-3.

The negative output terminal of the three-phase positive semi-cycle rectifying output circuit 1-2-2 is connected with the number 4 electrode 3-4 through the short network group 4 2-4, the positive output terminal of the three-phase positive semi-cycle rectifying output circuit 1-2-2 is connected with the number 3 electrode 3-3 through the short network group 4 2-4, and the three-phase positive semi-cycle rectifying output circuit 1-2-2 forms, through the short network group 4 2-4, a current circuit i4 with the electrode weld pool operated resistance load between the number 3 electrode 3-3 and the number 4 electrode 3-4.

The negative output terminal of the three-phase negative semi-cycle rectifying output circuit 1-3-1 is connected with the number 4 electrode 3-4 through the short network group 5 2-5, the positive output terminal of the three-phase negative semi-cycle rectifying output circuit 1-3-1 is connected with the number 5 electrode 3-5 through the short network group 5 2-5, and the three-phase negative semi-cycle rectifying output circuit 1-3-1 forms, through the short network group 5 2-5, a current circuit i5 with the electrode weld pool operated resistance load between the number 4 electrode 3-4 and the number 5 electrode 3-5.

The negative output terminal of the three-phase positive semi-cycle rectifying output circuit 1-3-2 is connected with the number 6 electrode 3-6 through the short network group 6 2-6, the positive output terminal of the three-phase positive semi-cycle rectifying output circuit 1-3-2 is connected with the number 5 electrode 3-5 through the short network group 6 2-6, and the three-phase positive semi-cycle rectifying output circuit 1-3-2 forms, through the short network group 6 2-6, a current circuit i6 with the electrode weld pool operated resistance load between the number 5 electrode 3-5 and the number 6 electrode 3-6.

A six-pulse current required by an arc of the number 1 electrode 3-1 is synthesized by the current circuit i1 and the current circuit i2; a six-pulse current required by an arc of the number 2 electrode 3-2 is synthesized by the current circuit i2 and the current circuit i3; a six-pulse current required by an arc of the number 3 electrode 3-3 is synthesized by the current circuit i3 and the current circuit i4; a six-pulse current required by an arc of the number 4 electrode 3-4 is synthesized by the current circuit i4 and the current circuit i5; a six-pulse current required by an arc of the number 5 electrode 3-5 is synthesized by the current circuit i5 and the current circuit i6; and a six-pulse current required by an arc of the number 6 electrode 3-6 is synthesized by the current circuit i6 and the current circuit i1.

Waveforms of currents of the current circuit i1, the current circuit i3, and the current circuit i5 are three-phase negative semi-cycle rectifying waveforms; waveforms of currents of the current circuit i2, the current circuit i4, and the current circuit i6 are three-phase positive semi-cycle rectifying waveforms; a delta-connection load of the electric furnace weld pool is a three-pulse direct current, and a phase difference of alternating current components of corresponding phases between the three-phase positive semi-cycle rectifying waveform and the three-phase negative semi-cycle rectifying waveform is 180°; and a current waveform of the arc of each electrode is six-pulse direct current, with the phase difference of 180° for alternating current components of the corresponding phases.

Example 3, in combination with what is shown in FIG. 16~FIG. 18, when the total number of electrodes of the multi-load layout device 3 is eight, the number of double-circuit direct current power supply packs is four, the four double-circuit direct current power supply packs may be represented by a first double-circuit direct current power supply pack 1-1, a second double-circuit direct current power supply pack 1-2, a third double-circuit direct current power supply pack 1-3, and a fourth double-circuit direct current power supply pack 1-4. The eight electrodes are represented by number 1 electrode 3-1, number 2 electrode 3-2, number 3 electrode 3-3, number 4 electrode 3-4, number 5 electrode 3-5, number 6 electrode 3-6, number 7 electrode 3-7, and number 8 electrode 3-8, respectively, wherein the number 1 electrode 3-1, the number 3 electrode 3-3, the number 5 electrode 3-5, and the number 7 electrode 3-7 are positive polarity electrodes, the number 2 electrode 3-2, the number 4 electrode 3-4, the number 6 electrode 3-6, and the number 8 electrode 3-8 are negative polarity electrodes, the number 1 electrode 3-1 is adjacent to the number 2 electrode 3-2 and the number 8 electrode 3-8, the number 3 electrode 3-3 is adjacent to the number 2 electrode 3-2 and the number 4 electrode 3-4, the number 5 electrode 3-5 is adjacent to the number 4 electrode 3-4 and the number 6 electrode 3-6, and the number 7 electrode 3-7 is adjacent to the number 6 electrode 3-6 and the number 8 electrode 3-8. For the first double-circuit direct current power supply pack 1-1, a positive output terminal of the three-phase negative semi-cycle rectifying output circuit 1-1-1 and a positive output terminal of the three-phase positive semi-cycle rectifying output circuit 1-1-2 are both connected with the number 1 electrode 3-1, a negative output terminal of the three-phase negative semi-cycle rectifying output circuit 1-1-1 is connected with the number 8 electrode 3-8, and a negative output terminal of the three-phase positive semi-cycle rectifying output circuit 1-1-2 is connected with the number 2 electrode 3-2. For the second double-circuit direct current power supply pack 1-2, a positive output terminal of the three-phase negative semi-cycle rectifying output circuit 1-2-1 and a positive output terminal of the three-phase positive semi-cycle rectifying output circuit 1-2-2 are both connected with the number 3 electrode 3-3, a negative output terminal of the three-phase negative semi-cycle rectifying output circuit 1-2-1 is connected with the number 2 electrode 3-2, and a negative output terminal of the three-phase positive semi-cycle rectifying output circuit 1-2-2 is connected with the number 4 electrode 3-4. For the third double-circuit direct current power supply pack 1-3, a positive output terminal of the three-phase negative semi-cycle rectifying output circuit 1-3-1 and a positive output terminal of the three-phase positive semi-cycle rectifying output circuit 1-3-2 are both connected with the number 5 electrode 3-5, a negative output terminal of the three-phase negative semi-cycle rectifying output circuit 1-3-1 is connected with the number 4 electrode 3-4, and a negative output terminal of the three-phase positive semi-cycle rectifying output circuit 1-3-2 is connected with the number 6 electrode 3-6. For the fourth double-circuit direct current power supply pack 1-4, a positive output terminal of the three-phase negative semi-cycle rectifying output circuit 1-4-1 and a positive output terminal of the three-phase positive semi-cycle rectifying output circuit 1-4-2 are both connected with the number 7 electrode 3-7, a negative output terminal of the three-phase negative semi-cycle rectifying output circuit 1-4-1 is connected with the number 6 electrode 3-6, and a negative output terminal of the three-phase positive semi-cycle rectifying output circuit 1-4-2 is connected with the number 8 electrode 3-8.

The negative output terminal of the three-phase negative semi-cycle rectifying output circuit 1-1-1 is connected with the number 8 electrode 3-8 through the short network group 1 2-1, the positive output terminal of the three-phase negative semi-cycle rectifying output circuit 1-1-1 is connected with the number 1 electrode 3-1 through the short network group 1 2-1, and the three-phase negative semi-cycle rectifying output circuit 1-1-1 forms, through the short network group 1 2-1, a current circuit it with the electrode weld pool operated resistance load between the number 1 electrode 3-1 and the number 8 electrode 3-8.

The negative output terminal of the three-phase positive semi-cycle rectifying output circuit 1-1-2 is connected with the number 2 electrode 3-2 through the short network group 2 2-2, the positive output terminal of the three-phase positive semi-cycle rectifying output circuit 1-1-2 is connected with the number 1 electrode 3-1 through the short network group 2 2-2, and the three-phase positive semi-cycle rectifying output circuit 1-1-2 forms, through the short network group 2 2-2, a current circuit i2 with the electrode weld pool operated resistance load between the number 1 electrode 3-1 and the number 2 electrode 3-2.

The negative output terminal of the three-phase negative semi-cycle rectifying output circuit 1-2-1 is connected with the number 2 electrode 3-2 through the short network group 3 2-3, the positive output terminal of the three-phase negative semi-cycle rectifying output circuit 1-2-1 is connected with the number 3 electrode 3-3 through the short network group 3 2-3, and the three-phase negative semi-cycle rectifying output circuit 1-2-1 forms, through the short network group 3 2-3, a current circuit i3 with the electrode weld pool operated resistance load between the number 2 electrode 3-2 and the number 3 electrode 3-3.

The negative output terminal of the three-phase positive semi-cycle rectifying output circuit 1-2-2 is connected with the number 4 electrode 3-4 through the short network group 4 2-4, the positive output terminal of the three-phase positive semi-cycle rectifying output circuit 1-2-2 is connected with the number 3 electrode 3-3 through the short network group 4 2-4, and the three-phase positive semi-cycle rectifying output circuit 1-2-2 forms, through the short network group 4 2-4, a current circuit i4 with the electrode weld pool operated resistance load between the number 3 electrode 3-3 and the number 4 electrode 3-4.

The negative output terminal of the three-phase negative semi-cycle rectifying output circuit 1-3-1 is connected with the number 4 electrode 3-4 through the short network group 5 2-5, the positive output terminal of the three-phase negative semi-cycle rectifying output circuit 1-3-1 is connected with the number 5 electrode 3-5 through the short network group 5 2-5, and the three-phase negative semi-cycle rectifying output circuit 1-3-1 forms, through the short network group 5 2-5, a current circuit i5 with the electrode weld pool operated resistance load between the number 4 electrode 3-4 and the number 5 electrode 3-5.

The negative output terminal of the three-phase positive semi-cycle rectifying output circuit 1-3-2 is connected with the number 6 electrode 3-6 through the short network group 6 2-6, the positive output terminal of the three-phase positive semi-cycle rectifying output circuit 1-3-2 is connected with the number 5 electrode 3-5 through the short network group 6 2-6, and the three-phase positive semi-cycle rectifying output circuit 1-3-2 forms, through the short network group 6 2-6, a current circuit i6 with the electrode weld pool operated resistance load between the number 5 electrode 3-5 and the number 6 electrode 3-6.

The negative output terminal of the three-phase negative semi-cycle rectifying output circuit 1-4-1 is connected with the number 6 electrode 3-6 through the short network group 7 2-7, the positive output terminal of the three-phase negative semi-cycle rectifying output circuit 1-4-1 is connected with the number 7 electrode 3-7 through the short network group 7 2-7, and the three-phase negative semi-cycle rectifying output circuit 1-4-1 forms, through the short network group 7 2-7, a current circuit i7 with the electrode weld pool operated resistance load between the number 6 electrode 3-6 and the number 7 electrode 3-7.

The negative output terminal of the three-phase positive semi-cycle rectifying output circuit 1-4-2 is connected with the number 8 electrode 3-8 through the short network group 8 2-8, the positive output terminal of the three-phase positive semi-cycle rectifying output circuit 1-4-2 is connected with the number 7 electrode 3-7 through the short network group 8 2-8, and the three-phase positive semi-cycle rectifying output circuit 1-4-2 forms, through the short network group 8 2-8, a current circuit i8 with the electrode weld pool operated resistance load between the number 7 electrode 3-7 and the number 8 electrode 3-8.

A six-pulse direct current required by an arc of the number 1 electrode 3-1 is synthesized by the current circuit i1 and the current circuit i2; a six-pulse direct current required by an arc of the number 2 electrode 3-2 is synthesized by the current circuit i2 and the current circuit i3; a six-pulse direct current required by an arc of the number 3 electrode 3-3 is synthesized by the current circuit i3 and the current circuit i4; a six-pulse direct current required by an arc of the number 4 electrode 3-4 is synthesized by the current circuit i4 and the current circuit i5; a six-pulse direct current required by an arc of the number 5 electrode 3-5 is synthesized by the current circuit i5 and the current circuit i6; a six-pulse direct current required by an arc of the number 6 electrode 3-6 is synthesized by the current circuit i6 and the current circuit i7; a six-pulse direct current required by an arc of the number 7 electrode 3-7 is synthesized by the current circuit i7 and the current circuit i8; and a six-pulse direct current required by an arc of the number 8 electrode 3-8 is synthesized by the current circuit i8 and the current circuit i1.

Waveforms of currents of the current circuit i1, the current circuit i3, the current circuit i5, and the current circuit i7 are three-phase negative semi-cycle rectifying waveforms; waveforms of currents of the current circuit i2, the current circuit i4, the current circuit i6, and the current circuit i8 are three-phase positive semi-cycle rectifying waveforms; a delta-connection load of the electric furnace weld pool is a three-pulse direct current, and a phase difference of alternating current components of corresponding phases between the three-phase positive semi-cycle rectifying waveform and the three-phase negative semi-cycle rectifying waveform is 180°; and a current waveform of the arc of each electrode is six-pulse direct current, with the phase difference of 180° for alternating current components of the corresponding phases.

Unless otherwise specified, components and relative steps of the steps, numerical expressions and numerical values illustrated in these embodiments do not limit the scope of the present disclosure.

In all of the examples shown and described herein, any specific value should be explained as merely illustrative, rather than restrictive, therefore, other examples of the exemplary embodiments may have different values.

It should be noted that similar reference numerals and letters represent similar items in the following accompanying drawings, therefore, once a certain item is defined in one accompanying drawing, it is not needed to be further defined or explained in subsequent accompanying drawings.

In addition, in the description of the embodiments of the present disclosure, it should be indicated that unless otherwise specified and defined explicitly, terms "mount", "join", and "connect" should be construed in a broad sense. For example, it may be fixed connection, detachable connection, or integral connection; it may be mechanical connection, and also may be electrical connection; it may be direct connection, indirect connection via an intermediate medium, or inner communication between two elements. For those ordinarily skilled in the art, specific meanings of the above-mentioned terms in the present disclosure could be understood according to specific circumstances.

In the description of the present disclosure, it should be indicated that orientation or positional relations indicated by terms "center", "upper", "lower", "left", "right", "vertical", "horizontal", "inner", "outer" and so on are based on orientation or positional relations as shown in the accompanying drawings, merely for facilitating the description of the present disclosure and simplifying the description, rather than indicating or implying that related devices or elements have to be in the specific orientation, or configured or operated in a specific orientation, therefore, they should not be construed as limiting the present disclosure. Besides, terms "first", "second", "third", and "forth" are merely for descriptive purpose, but should not be construed as indicating or implying relative importance.

Finally, it should be indicated that the embodiments described above are merely specific embodiments of the present disclosure, for illustrating the technical solutions of the present disclosure, rather than limiting the present disclosure. The scope of protection of the present disclosure should not be limited thereto. While the detailed description is made to the present disclosure with reference to the above-mentioned embodiments, those ordinarily skilled in the art should understand that for any person skilled familiar with the technical field, in the technical scope disclosed by the present disclosure, the technical solutions recited in the above-mentioned embodiments still can be modified or readily changed, or equivalent substitutions can be made to some of the technical features therein; and these modifications, changes or substitutions do not make the corresponding technical solutions essentially depart from the spirit and scope of the technical solutions of the embodiments of the present disclosure, and all of them should be covered within the scope of protection of the present disclosure. Therefore, the scope of protection of the present disclosure should be based on the scope of protection of the claims.

INDUSTRIAL APPLICABILITY

The rectifying power supply device designed in the present disclosure solves the problem of too high power consumption thereof, reasonably increases the number of current circuits of the weld pool load between the electrodes of the smelting electric furnace, and evenly distributes the electric power inside the electric furnace weld pool, then finally, the output characteristics of the rectifying power supply device are matched with the load characteristics of the electric furnace weld pool, and thus the practical industrial operating value of smelting with a direct current is improved.

What is claimed is:

1. A direct current smelting electric furnace, comprising
a rectifying control circuit,
a rectifying power supply device,
a short network device,
a multi-load layout device, and
an electric furnace body;
wherein
the multi-load layout device comprises a plurality of electrodes;
the rectifying control circuit is connected to the rectifying power supply device, the rectifying power supply device is connected to the multi-load layout device through the short network device, and the multi-load layout device is connected to a weld pool inside the electric furnace body (4);
the rectifying control circuit is configured to control the rectifying power supply device to operate;
the rectifying power supply device is configured to provide direct current electric energy to the multi-load layout device;
the short network device is provided in an electrical connection line between the rectifying power supply device and the multi-load layout device;
the multi-load layout device is configured to generate, after being energized, arc heat and resistance heat inside the weld pool of the electric furnace body, and the arc heat and the resistance heat smelt furnace materials inside the weld pool of the electric furnace body, the rectifying power supply device comprises at least two double-circuit direct current power supply packs, wherein each double-circuit direct current power supply pack of the at least two double-circuit direct current power supply packs comprises a three-phase negative semi-cycle rectifying output circuit and a three-phase positive semi-cycle rectifying output circuit, wherein the three-phase negative semi-cycle rectifying output circuit comprises a first positive output terminal and a first negative output terminal;

the three-phase positive semi-cycle rectifying output circuit comprises a second positive output terminal and a second negative output terminal;

four output terminals of the each double-circuit direct current power supply pack are respectively connected to three electrodes of the plurality of electrodes of the multi-load layout device through the short network device, to constitute two current circuits through a load of the weld pool of the electric furnace body;

each electrode of the plurality of electrodes of the multi-load layout device is connected, through the short network device, to two homo-polar output terminals of the three-phase negative semi-cycle rectifying output circuit and the three-phase positive semi-cycle rectifying output circuit associated with a current circuit; and a number of output current circuits of the rectifying power supply device is equal to a number of the plurality of electrodes of the multi-load layout device.

2. The direct current smelting electric furnace according to claim 1, wherein four output terminals of the each double-circuit direct current power supply pack comprise two homo-polar output terminals and two heteropolar output terminals;

the two homo-polar output terminals of the each double-circuit direct current power supply pack, after passing through the short network device, are collinearly connected to an electrode of the three electrodes of the multi-load layout device, the two heteropolar output terminals of the each double-circuit direct current power supply pack, after passing through the short network device, are connected to two adjacent heteropolar electrodes of the three electrodes of the multi-load layout device, wherein the two adjacent heteropolar electrodes are associated with the current circuit in the multi-load layout device, the each double-circuit direct current power supply pack further comprises a transformer three-phase primary side winding, wherein the transformer three-phase primary side winding supplies, after being energized, three-phase alternating electric energy with electromagnetic mutual inductance, to the three-phase negative semi-cycle rectifying output circuit and the three-phase positive semi-cycle rectifying output circuit, respectively, through a transformer ferromagnetic core.

3. The direct current smelting electric furnace according to claim 2, wherein the three-phase positive semi-cycle rectifying output circuit outputs a three-pulse direct current with a three-phase positive semi-cycle rectifying waveform, the three-phase negative semi-cycle rectifying output circuit outputs a three-pulse direct current with a three-phase negative semi-cycle rectifying waveform, and an arc current between each of the three electrodes and the furnace materials of the weld pool of the electric furnace body is a six-pulse direct current, wherein a phase difference of alternating current components of phases between the three-phase positive semi-cycle rectifying waveform and the three-phase negative semi-cycle rectifying waveform is 180 degrees.

4. The direct current smelting electric furnace according to claim 2, wherein the number of the plurality of electrodes of the multi-load layout device is an even number greater than 2, the number of the at least two double-circuit direct current power supply packs is 50% of the number of the plurality of electrodes of the multi-load layout device, and a number of the three-phase negative semi-cycle rectifying output circuit in the rectifying power supply device is equal to a number of the three-phase positive semi-cycle rectifying output circuit in the rectifying power supply device and is 50% of the number of the plurality of electrodes of the multi-load layout device.

5. The direct current smelting electric furnace according to claim 4, wherein a planar layout of the plurality of electrodes of the multi-load layout device is in a shape selected from the group consisting of a triangular shape, a square shape, a rectangular shape and a parallelogram shape, and adjacent electrodes of the plurality of electrodes are equidistant.

6. The direct current smelting electric furnace according to claim 5, wherein the plurality of electrodes of the multi-load layout device comprise four electrodes, and a planar layout of the four electrodes is in a square shape.

7. The direct current smelting electric furnace according to claim 4, wherein the plurality of electrodes of the multi-load layout device comprise four electrodes, and a planar layout of the four electrodes is in a square shape.

8. The direct current smelting electric furnace according to claim 2, wherein the number of the plurality of electrodes of the multi-load layout device is an even number greater than 3, the number of the at least two double-circuit direct current power supply packs is 50% of the number of the plurality of electrodes of the multi-load layout device, and a number of the three-phase negative semi-cycle rectifying output circuit in the rectifying power supply device is equal to a number of the three-phase positive semi-cycle rectifying output circuit in the rectifying power supply device and is 50% of the number of the plurality of electrodes of the multi-load layout device.

9. The direct current smelting electric furnace according to claim 8, wherein a planar layout of the plurality of electrodes of the multi-load layout device is in a shape selected from the group consisting of a triangular shape, a square shape, a rectangular shape and a parallelogram shape, and adjacent electrodes of the plurality of electrodes are equidistant.

10. The direct current smelting electric furnace according to claim 9, wherein the plurality of electrodes of the multi-load layout device comprise four electrodes, and a planar layout of the four electrodes is in a square shape.

11. The direct current smelting electric furnace according to claim 8, wherein the plurality of electrodes of the multi-load layout device comprise four electrodes, and a planar layout of the four electrodes is in a square shape.

12. The direct current smelting electric furnace according to claim 1, wherein the number of the plurality of electrodes of the multi-load layout device is an even number greater than 2, the number of the at least two double-circuit direct current power supply packs is 50% of the number of the plurality of electrodes of the multi-load layout device, and a number of the three-phase negative semi-cycle rectifying output circuit in the rectifying power supply device is equal to a number of the three-phase positive semi-cycle rectifying output circuit in the rectifying power supply device and is 50% of the number of the plurality of electrodes of the multi-load layout device.

13. The direct current smelting electric furnace according to claim 12, wherein a planar layout of the plurality of electrodes of the multi-load layout device is in a shape selected from the group consisting of a triangular shape, a square shape, a rectangular shape and a parallelogram shape, and adjacent electrodes of the plurality of electrodes are equidistant.

14. The direct current smelting electric furnace according to claim 12, wherein the plurality of electrodes of the multi-load layout device comprise is four electrodes, and a planar layout of the four electrodes is in a square shape.

15. The direct current smelting electric furnace according to claim 12, wherein the plurality of electrodes of the multi-load layout device comprise is six electrodes, and a planar layout of the six electrodes is in a triangular shape, a rectangular shape or a parallelogram shape.

16. The direct current smelting electric furnace according to claim 12, wherein the plurality of electrodes of the multi-load layout device comprise is eight electrodes, and a planar layout of the eight electrodes is in a rectangular shape or a parallelogram shape.

17. The direct current smelting electric furnace according to claim 1, wherein the short network device comprises a plurality of short network groups, wherein
   each of the plurality of short network groups comprises two equivalent conductive wires, equivalent circuit inductive reactance of the two equivalent conductive wires of each of the plurality of short network groups is used as an interphase reactor for an output of the rectifying power supply device, and each output terminal of the rectifying power supply device is connected to an electrode of the plurality of electrodes through one of the two equivalent conductive wires in one of the plurality of short network groups of the short network device.

18. The direct current smelting electric furnace according to claim 1, wherein
   the three-phase negative semi-cycle rectifying output circuit comprises a transformer first three-phase secondary side winding and a first high-power rectifying assembly, and the first high-power rectifying assembly comprises three first uncontrollable rectifying diodes, wherein
      unlike terminals of the transformer first three-phase secondary side winding are respectively connected to anodes of the three first uncontrollable rectifying diodes,
      cathodes of the three first uncontrollable rectifying diodes, after being collinearly connected, are connected to the first positive output terminal, and
      like terminals of the transformer first three-phase secondary side winding, after being collinearly connected, are connected to the first negative output terminal; and
   the three-phase positive semi-cycle rectifying output circuit comprises a transformer second three-phase secondary side winding and a second high-power rectifying assembly, and the second high-power rectifying assembly comprises three second uncontrollable rectifying diodes, wherein
      like terminals of the transformer second three-phase secondary side winding are connected to anodes of the three second uncontrollable rectifying diodes, respectively,
      cathodes of the three second uncontrollable rectifying diodes, after being collinearly connected, are connected to the second positive output terminal, and
      unlike terminals of the transformer second three-phase secondary side winding, after being collinearly connected, are connected to the second negative output terminal.

19. The direct current smelting electric furnace according to claim 1, wherein
   the three-phase negative semi-cycle rectifying output circuit comprises a transformer first three-phase secondary side winding, a first high-power rectifying assembly, and a first freewheel diode, and the first high-power rectifying assembly comprises three first controllable rectifying thyristors, wherein
      control electrodes of the three first controllable rectifying thyristors are connected to the rectifying control circuit,
      unlike terminals of the transformer first three-phase secondary side winding are respectively connected to anodes of the three first controllable rectifying thyristors,
      cathodes of the three first controllable rectifying thyristors, after being collinearly connected, are connected to a cathode of the first freewheel diode and the first positive output terminal; and
      like terminals of the transformer first three-phase secondary side winding, after being collinearly connected, are connected to an anode of the first freewheel diode and the first negative output terminal; and
   the three-phase positive semi-cycle rectifying output circuit comprises a transformer second three-phase secondary side winding, a second high-power rectifying assembly, and a second freewheel diode, and the second high-power rectifying assembly comprises three second controllable rectifying thyristors, wherein
      control electrodes of the three second controllable rectifying thyristors are connected to the rectifying control circuit,
      like terminals of the transformer second three-phase secondary side winding are respectively connected to anodes of the three second controllable rectifying thyristors,
      cathodes of the three second controllable rectifying thyristors, after being collinearly connected, are connected to a cathode of the second freewheel diode and the second positive output terminal, and
      unlike terminals of the transformer second three-phase secondary side winding, after being collinearly connected, are connected to an anode of the second freewheel diode and the second negative output terminal.

20. The direct current smelting electric furnace according to claim 19, wherein
   the first freewheel diode is configured to provide a first freewheel circuit for a load circuit-induced current when the three-phase negative semi-cycle rectifying output circuit is not in full-load output, to prevent the load circuit-induced current from returning to the transformer first three-phase secondary side winding; and
   the second freewheel diode is configured to provide a second freewheel circuit for the load circuit-induced current when the three-phase positive semi-cycle rectifying output circuit is not in full-load output, to prevent the load circuit-induced current from returning to the transformer second three-phase secondary side winding.

\* \* \* \* \*